United States Patent [19]

Kondo et al.

[11] Patent Number: 5,379,515
[45] Date of Patent: Jan. 10, 1995

[54] PROCESS FOR PREPARING ELECTRICAL CONNECTING MEMBER

[75] Inventors: Hiroshi Kondo, Osaka; Tetsuo Yoshizawa, Yokohama; Toyohide Miyazaki, Ibaraki; Takashi Sakaki, Tokyo; Yoshimi Terayama, Odawara; Yoichi Tamura, Tokyo; Takahiro Okabayashi, Tokyo; Kazuo Kondo, Tokyo; Yasuo Nakatsuka, Tokyo; Yuichi Ikegami, Osaka, all of Japan

[73] Assignees: Canon Kabushiki Kaisha, Tokyo; Sumitomo Metal Industries, Osaka, both of Japan

[21] Appl. No.: 20,141

[22] Filed: Feb. 16, 1994

Related U.S. Application Data

[63] Continuation of Ser. No. 112,216, Aug. 26, 1993, abandoned, which is a continuation of Ser. No. 26,101, Mar. 1, 1993, abandoned, which is a continuation of Ser. No. 866,274, Apr. 13, 1992, abandoned, which is a continuation of Ser. No. 625,801, Dec. 11, 1990, abandoned.

[30] Foreign Application Priority Data

| Dec. 11, 1989 | [JP] | Japan | 1-321733 |
| Dec. 11, 1989 | [JP] | Japan | 1-321734 |
| Mar. 16, 1990 | [JP] | Japan | 2-67820 |
| Mar. 16, 1990 | [JP] | Japan | 2-67821 |
| Mar. 30, 1990 | [JP] | Japan | 2-85420 |

[51] Int. Cl.⁶ .............................................. H01K 3/10
[52] U.S. Cl. ........................................ 29/852; 29/876; 174/262; 205/125; 439/66
[58] Field of Search .............. 29/825, 830, 827, 874, 29/424, 829, 851; 174/261, 262, 263; 205/125; 428/901; 439/66

[56] References Cited

U.S. PATENT DOCUMENTS

| 2,961,746 | 11/1960 | Lyman | 29/848 |
| 3,311,966 | 4/1967 | Shaheen et al. | 29/852 X |
| 4,067,104 | 1/1978 | Tracy | 29/424 X |
| 4,249,302 | 2/1981 | Crepeau | 428/901 X |
| 4,612,083 | 9/1986 | Yasumoto et al. | 156/307.3 X |
| 4,642,160 | 2/1987 | Burgess | 29/852 X |
| 4,799,984 | 1/1989 | Rellick | 29/829 X |
| 4,806,188 | 2/1989 | Rellick | 29/851 X |
| 4,908,940 | 3/1990 | Amane et al. | 174/262 X |
| 4,911,796 | 3/1990 | Reed . | |
| 4,925,723 | 5/1990 | Bujatti et al. | 29/852 X |
| 4,926,549 | 5/1990 | Yoshigawa et al. | 29/876 |
| 4,961,259 | 10/1990 | Schreiber | 29/852 |

FOREIGN PATENT DOCUMENTS

| 256778 | 2/1988 | European Pat. Off. . | |
| 61-272941 | 12/1986 | Japan | 437/209 |
| 63222437 | 9/1988 | Japan . | |
| 88224235 | 9/1988 | Japan . | |
| 1-205595 | 8/1989 | Japan . | |
| 91-07093 | 5/1991 | WIPO . | |

Primary Examiner—Carl J. Arbes
Attorney, Agent, or Firm—Fitzpatrick, Cella, Harper & Scinto

[57] ABSTRACT

A process for preparing an electrical connecting member having a holding member comprising an electrically insulating material and a plurality of electroconductive members equipped in the holding member under the state mutually insulated from each other, one end of the each electroconductive member being exposed at one surface of the holding member, and the other end of the each electroconductive member being exposed at the other surface of the each holding member, the process having the following steps, namely the step of forming a matrix having the state where the holding member is in contact with a base member for supporting the holding member the step of irradiating a high energy beam on the matrix from the holding member side to remove the holding member, thereby forming a plurality of holes the step of filling an electroconductive material which becomes the electroconductive member into the plurality of holes formed and the step of removing the base member.

77 Claims, 24 Drawing Sheets

PROCESS FOR PREPARING ELECTRICAL CONNECTING MEMBER

This application is a continuation of application Ser. No. 08/112,216 filed Aug. 26, 1993, now abandoned, which is a continuation of application Ser. No. 08/026,101 filed Mar. 1, 1993, abandoned, which is a continuation of application Ser. No. 07/866,274, filed Apr. 13, 1992, abandoned, which is a continuation of application Ser. No. 07/625,801, filed Dec. 11, 1990, abandoned.

BACKGROUND OF THE INVENTION

1. Field of the Invention

This invention relates to a process for preparing an electrical connecting member to be used in connecting electrically electrical circuit parts to each other, particularly to a process for preparing an electrical connecting member which connects electrically electrical parts to each other with a plurality of electroconductive members held by an electrical insulating material.

2. Related Background Art

In the prior art, as the method for connecting electrically electrical circuit parts to each other, there have been known the wire bonding method, TAB (Tape Automated Bonding) method, etc. However, in these methods, there have been involved the drawbacks that they cannot correspond to the increase of connecting points between the both electrical circuit parts, and are also high in cost. In order to solve such drawbacks, there has been disclosed in the art to connect electrical circuit parts to each other by use of an electrical connecting member having a constitution equipped with a plurality of electroconductive members insulated from each other in an insulating holding member in, for example, Japanese Laid-Open Patent Application Nos. 63-222437, 63-224235, etc.

FIG. 18 illustrates schematically electrical connection between the electrical circuit parts by use of such electrical connecting member, and in the Figure, 31 shows the electrical connecting member, and 32, 33 show the electrical circuit parts to be connected. The electrical connecting member 31 has a plurality of electrical members 34 comprising a metal or an alloy equipped in the holding member 35 comprising an electrically insulating material under the state where the electroconductive members 34 are electrically insulated from each other, and has one end 38 of the electroconductive member 34 exposed on one side of the electrical circuit part 32, and the other end 39 of the electroconductive member exposed on the other side of the electrical circuit part 33 (FIG. 18A). The connecting portion 36 of one electrical circuit part 32 and one end 38 exposed of the electroconductive member 34 are bonded together by alloy formation, while the connecting portion 37 of the other electrical circuit part 33 and the other end 39 exposed of the electroconductive member 34 by alloy formation, thereby connecting electrically electrical circuit parts 32 and 33 to each other (FIG. 18B).

In such electrical connecting member, there are the advantages as shown below.

(1) By making the size of the electroconductive member finer, the connecting portion of the electrical circuit part can be made compact, and also for such reason, the connecting points can be increased. Hence, higher density connection mutually between electrical circuit parts can be done.

(2) Even for electrical circuit parts with different thicknesses, the height of the electrical circuit parts can be made always constant by varying the thickness of the electrical connecting member, whereby multi-layer connection can be done easily to enable high density practical mounting.

(3) By making the protruded height of the electroconductive member to be connected with the connecting portion of the electrical circuit part higher, even one with the connecting portion of the electrical circuit part sunk from the surface can be stably connected, whereby it is possible to connect electrical circuit parts easily with complicated shapes to each other.

(4) Since the heat generated from the electrical circuit parts is radiated through the holding member of the electrical connecting member, the electrical characteristic change is extremely small. Also, because of excellent characteristic of radiation of heat, the influence of thermal fatigue is small and reliability is also high. At this time, the holding member may be also constituted of an insulating material, and its effect becomes still greater if insulating ceramics with high thermal conductivity is used as the holding member.

(5) Since the connecting length in connection mutually between the electrical circuit parts is short, impedance can be reduced and speed-up of electrical parts can be effected. By mixing of a metal, etc. with low dielectric constant into the holding member, the parasitic capacity can be made smaller, and further impedance can be also reduced.

As the process for preparing such electroconductive member as described above for effecting electrical multi-point connection mutually between electrical circuit parts, there is one proposed in U.S. Pat. No. 4,926,549. In the following, this preparation process is described briefly by referring to FIG. 19 showing schematically its steps.

First, a base member 51 comprising a metal sheet such as copper foil, etc. is prepared (FIG. 19A), and on the base member 51 is coated a photosensitive polyimide resin 52 by a spin coater, which is then pre-baked at a temperature around 100° C. (FIG. 19B). The film thickness of the polyimide resin 52 coated is made thicker than the desired film thickness of the holding member in the electrical connecting member prepared in view of the reduction by curing shrinkage. Through a photomask forming a predetermined pattern (not shown), light is irradiated (exposed) on the photosensitive resin 52, followed by developing. At the irradiated portion, the photosensitive resin 52 remains, while at the unirradiated portion, the polyimide resin 52 is removed by the development, whereby a plurality of holes 53 are formed (FIG. 19C). After curing the polyimide resin 52 by elevating the temperature to 200° to 400° C., the base member 51 is dipped in an etchant for the metal to effect etching, thereby forming concavities 54 communicated to the holes 53 on the base member 51 (FIG. 19D). Next, by application of gold plating with the base member 51 as the common electrode, gold 55 is filled into the holes 53, the concavities 54, and gold plating is continued until bumps are formed (FIG. 19E). Finally, the base member 51 is removed by etching to prepare an electrical connecting member 31 (FIG. 19F).

In the electrical connecting member 31 thus prepared, the gold 55 constitutes the electroconductive member 34, and the polyimide resin 52 constitutes the holding member 35. The dimensions of the respective portions in the electrical connecting member 31 are made about 10 μm for the thickness of the polyimide resin 52 (holding member 35), about 20 μm for the diameter of the hole 53 (electroconductive member 34), about 40 μm for pitch, and about several μm for protruded amount at both front and back of the electroconductive member 34.

However, in the preparation process of the prior art proposed in U.S. Pat. No. 4,926,549 as described above, the tasks to be solved as described below remain and there was left room to be further improved.

Since a polyimide resin which becomes the holding member is coated by a spin coater on a base member, particularly when a holding member with a thick film is formed, it is difficult to set the thickness of the holding member with good precision, above all to form a holding member with a uniform film thickness. Also, a polyimide resin is shrinked during thermosetting and has a different coefficient of linear expansion from the base member and therefore has residual stress, whereby the film thickness of the holding member and the pattern dimensions of the hole to be formed can be controlled with difficulty.

Photosensitive polyimide resins include PL-1100, 1200 (Hitachi Chemical Co.,Ltd.), Photoneece (TORAY INDUSTRIES,INC.), Bimide (CIBA GEIGY Ltd.), Selectilax (E. Mark), Lithocoat (Ube Industries, Ltd.), etc., but as compared with the kinds of already imidated commercially available polyimide resins, their number is still very small and range of choice is small. Also, their price is very high.

On the other hand, the film thickness of the photosensitive polyimide resin 52 provided on the metal sheet 51 is large, and yet when a small hole with a small diameter is attempted to be formed as the hole 53, according to the photolithographic technique, a hole with an aspect ratio of 1 or more can be formed with difficulty, therefore not only formation of the thru-hole 53 with good precision is difficult, but also variance occurs in shape of the concavities 54 to be formed by etching on the metal sheet 51, whereby there are involved such tasks that the bump shape cannot be constant, that the stability of the electrical characteristics is low and that the yield is also lowered.

Further, the bump formed on the opposite surface of the photosensitive polyimide resin to the metal sheet is formed by continuing growth of gold plating onto the polyimide resin through the hole perforated through the polyimide resin. However, when the bump height protruded is attempted to be made higher, there is a fear that expanding may occur not only in the height direction but also in the lateral direction, whereby short circuit with adjoining bump may occur. If the interval between the bumps is broadened in order to avoid short circuit, no connection of high density electrical circuit parts (e.g. semiconductor IC chips) can be done. Shortly speaking, if the growth of the protruded bump in the lateral direction is not restricted, it is very difficult to make the bump height higher.

On the other hand, the metal sheet is etched by wet etching to form a concavity, and this concavity becomes shaped in a bump protruded on the metal sheet side. However, since wet etching is isotropic etching, in aiming to make the bump protruded on the metal sheet side still higher, if the concavity is made deeper, expanding also occurs in the lateral direction (side etching), whereby there is a fear that short circuit may occur with adjoining bump. If the interval between the bumps is broadened, it becomes impossible to connect high density electrical circuit parts (e.g. semiconductor IC chips). Shortly speaking, also in this case, there has been involved the task to be solved that it is difficult to make the bump height sufficiently high and yet maintain high density.

SUMMARY OF THE INVENTION

The present invention has been accomplished in order to solve the tasks as described above, and an object of the present invention is to provide a process for preparing an electrical connecting member which can fill an electroconductive material with good precision and at narrow pitches while maintaining insulation mutually between the adjoining holes without need of using a photosensitive resin as a holding member and realize connection of high density mutually between electrical circuit parts, by perforating holes through an insulating layer which becomes the holding member by irradiation of a high energy beam and filling an electroconductive material which becomes the electroconductive member into the holes.

Another object of the present invention is to provide a process for preparing an electrical connecting member which can prevent drop-off of the electroconductive member with good yield and at low cost, by perforating holes through an insulating layer which becomes the holding member by irradiation of a high energy beam and filling an electroconductive material which becomes the electroconductive member into the holes, and at that time providing the electroconductive member on the insulating layer surface to the range larger than the diameter of said hole.

Still another object of the present invention is provide a process for preparing an electrical connecting member which can effect sure electrical connection without impairing high density by making the shape of the electroconductive member provided on the above-mentioned insulating layer surface as desired.

DETAILED DESCRIPTION OF THE PREFERRED EMBODIMENTS

Figure 1A:
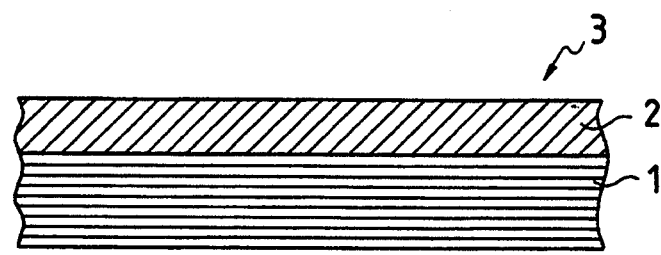
FIGS. 1A–1E are schematic illustrations showing the preparation steps in the first example of the present invention.

In the process for preparing the electrical connecting member of the present invention, a high energy beam is irradiated on an electrically insulating material which becomes the holding member to form a pattern of a plurality of holes. Accordingly, holes can be formed at high density and the pitch of the electroconductive members can be made finer. There is no need to take shrinkage during e.g. heating curing as in the prior art into consideration, whereby the film thickness of the holding member can be easily done and also control of the formed pattern of the holes is easy. There is also no need to use a photosensitive resin as the electrically insulating material, and therefore the range of choice of materials can be broadened to lower the cost. Further, even when the electrically insulating material (holding member) may be thick, fine holes with an aspect ratio of 1 or more can be formed to make high density possible.

When a high energy beam is irradiated onto a matrix having a holding member on a base member, concavities can be formed also on the base member at the same time, and therefore the protruded shape of the electroconductive member filling the holes of the holding member can be made sufficiently protruded without impairing high density.

When bonding to a holding member through which holes are opened by a laser after provision of concavities on the base member surface, the concavity shape of the base member can be determined regardless of the thickness of the holding member, and therefore it becomes easier to obtain finally uniform protruded portions for drop-off prevention. At this time, if the holes of the holding member or the concavities on the base member surface or both thereof are filled temporarily with a soluble resin, and the base member and the holding member are bonded together, the holes and the concavities will not be filled with an adhesive and the adhesive can be removed more easily.

Further, by provision of a member defining the shape of the protruded portions of the electroconductive member, a protruded portion with a desired shape can be obtained.

The present invention is now described by referring to the drawings showing its examples, but the present invention is not limited by the following examples, provided that it is constituted so as to accomplish the object of the present invention.

FIGS. 1A–1E are schematic sectional views showing the preparation steps of the first example according to the present application. First, a matrix 3 comprising an insulating layer 2 comprising a polyimide resin laminated on a base member 1 comprising copper is prepared (FIG. 1A). The matrix 3 may be prepared by depositing the metal material of the base member 1 on the insulating layer 2 by vapor deposition, or alternatively by plating, and also by combination of the both. Also, on one surface of the base member 1, a polyimide resin for formation of the insulating layer 2 may be coated.

Figure 1B:
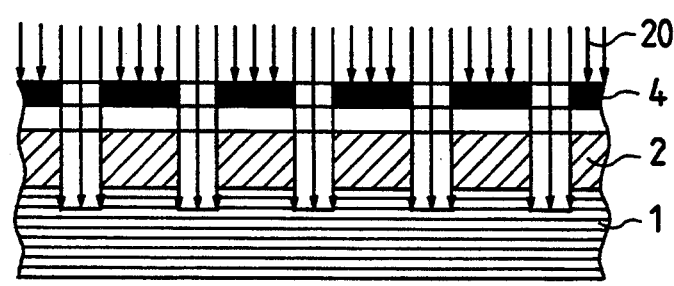
Figure 1C:
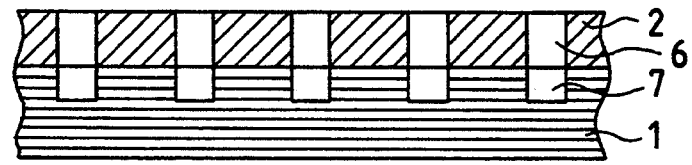
Figure 1D:
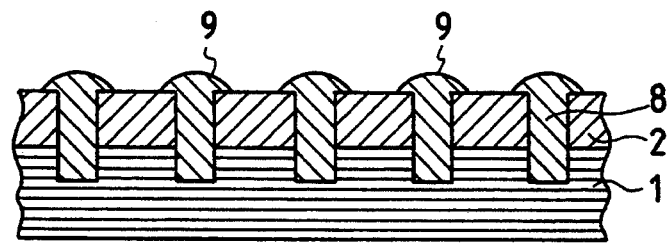
Figure 1E:
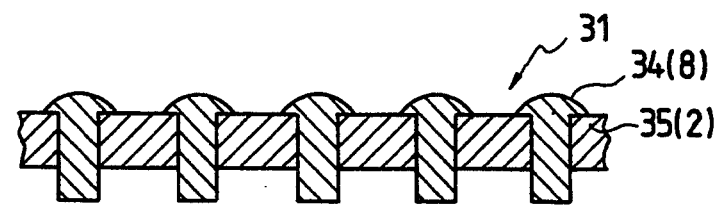

Next, with a post-type mask 4 placed above the insulating layer 2, KrF excimer laser beam 20 which is a high energy beam is irradiated from the insulating layer 2 on the matrix 3 (FIG. 1B). By the photoenergy of the excimer laser beam 20 which is a high energy beam, the molecules of the insulating layer 2 (polyimide resin) at the irradiated portion are cleaved off, whereby a plurality of pores 6 reaching the surface of the base member 1 are formed through the insulating layer 2. Even when the surface of the base member 1 is exposed, irradiation of the excimer layer beam 20 is continued to remove a part of the base member 1, thereby forming holes 7 communicated to the pores 6 to a predetermined depth on the base member 1 (FIG. 1C). In this case, the depth of the holes 7 is controlled by controlling the pulse number corresponding to the irradiation energy per one pulse of the excimer laser beam 20 and the etching rate for the base member 1. Next, by gold plating by use of the base member 1 as the common electrode, an electroconductive material 8 comprising gold is filled into the pores 6, holes 7 (FIG. 1D). In this case, filling of the electroconductive material 8 is done until protruded from the upper surface of the insulating layer 2, and the protruded portions become the gold bumps 9. Finally, by use of an etchant which will not etch the insulating layer 2 and the electroconductive material 8 to etch away the base member 1, thereby preparing an electrical connecting member 31 (FIG. 1E).

In this example, in the electrical connecting member 31 prepared, the electroconductive member 34 comprises gold, and the holding member 35 comprises a polyimide resin.

Figure 2A:
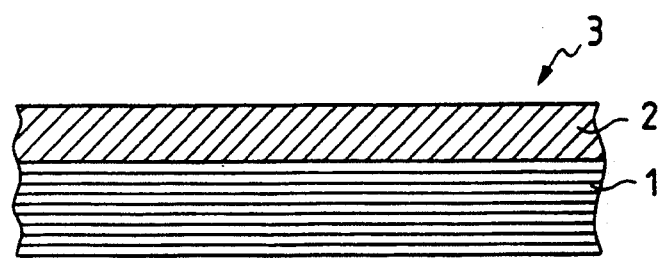
FIGS. 2A–2E are schematic illustrations showing the preparation steps in the second example of the present invention.
Figure 2B:
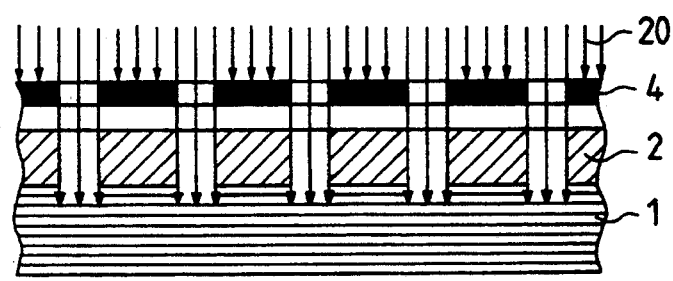
Figure 2C:
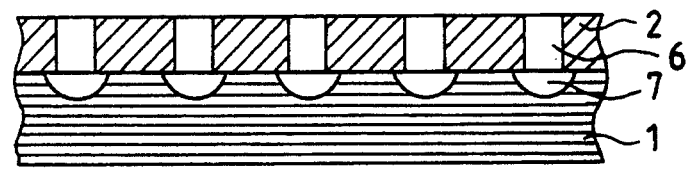

FIGS. 2A–2E are schematic sectional views showing the preparation steps of the second example of the present application. The step shown in FIG. 2A is the same as the step shown in FIG. 1A, and therefore its description is omitted. By irradiation of the excimer laser beam 20, pores 6 communicated to the base member 1 surface are formed through the insulating layer 2 (FIG. 2C), and then on the surface of the base member 1 exposed, chemical etching is applied by use of an etchant which will not etch the insulating layer 2 to form concavities 7 (FIG. 2C). In this case, the size expanded in the lateral direction is made smaller than half of the interperipheral distance of adjoining pores 6. By controlling thus expanding in the lateral direction, the adjoining concavities 7 will not be mutually communicated to each other. The size of the concavities 7 formed on the base member 1 becomes larger than the diameter of the pores 6 formed through the insulating layer 2.

Figure 2D:
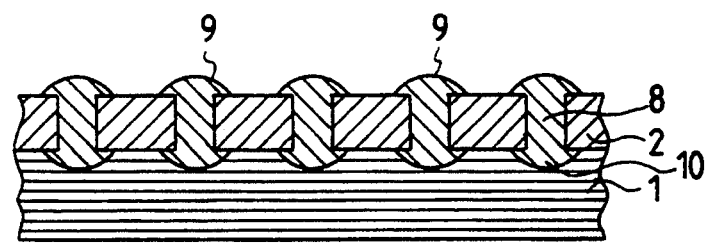
Figure 2E:
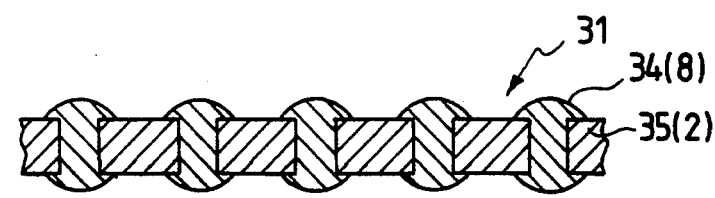

Next, by gold plating by use of the base member 1 as the common electrode, an electroconductive material 8 comprising gold is filled into the pores 6 and the concavities 7 (FIG. 2D). In this case, filling of the electroconductive material 8 is done until protruded from the upper surface of the insulating layer 2, and the protruded portion becomes the gold bump 9. The lower portion of the electroconductive mateiral 8 becomes the gold bump 10 corresponding to the shape of the concavity 7. Finally, by use of an etchant which will not etch the insulating layer 2 and the electroconductive material 8, the base member 1 is etched away to prepare an electrical connecting member 31 constituted of the holding member 35 and the electroconductive member 34 (FIG. 2E).

The electrical connecting member thus prepared has larger diameter of the electroconductive member 34 (gold bumps 9, 10) exposed than the diameter of the electroconductive member 34 (electroconductive materials 8) filled in the holding member 35 (insulating layer 2), and therefore the electroconductive member 34 will not be dropped off from the holding member 35, and no defective connection accompanied with drop-off of the electroconductive member will be generated when affecting connection with electrical circuit parts.

Figure 3A:
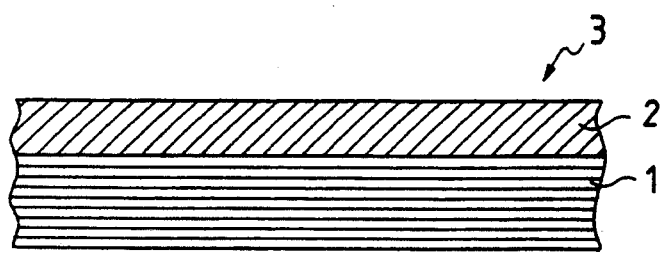
FIGS. 3A–3F are schematic illustrations showing the preparation steps in the fourth example of the present invention.
Figure 3B:
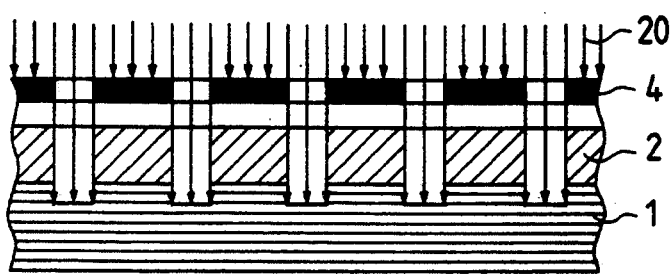
Figure 3C:
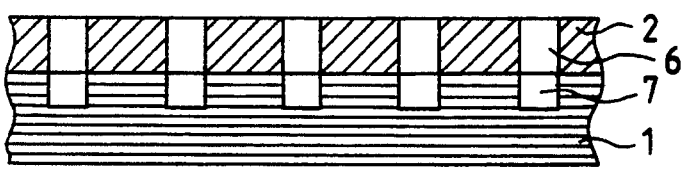
Figure 3D:
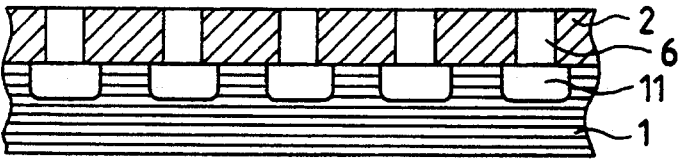

FIGS. 3A–3F are schematic sectional views showing the preparation steps of the third example of the present application. The steps shown in FIGS. 3A to FIG. 3C are the same as the steps shown in FIGS. 1A to FIG. 1C, and therefore description thereof is omitted. After formation of pores 6, holes 7 mutually communicated on the matrix 3 by irradiation of the excimer laser beam 20 which is a high energy beam (FIG. 3C), on the surface of the base member 1 exposed is applied chemical etching by use of an etchant which will not etch the insulating layer 2, to expand the holes 7 in the vertical direction and the lateral direction to form holes 11 (FIG. 3D). In this case, the size expanded in the lateral direction is made smaller than half of the interperipheral distance of adjoining pores 6. By controlling thus expansion in the lateral direction, the adjoining holes 11 will not be mutually communicated to each other. The size of the diameter of the hole 11 formed on the base member becomes larger than that of the hole 6 formed through the insulating layer 2. In this example, before chemical etching, holes 7 are formed in the downward direction by irradiation of the excimer laser 20, and therefore the holes 11 formed after chemical etching will be shaped as expanded larger toward the downward direction rather than toward the lateral direction.

Figure 3E:
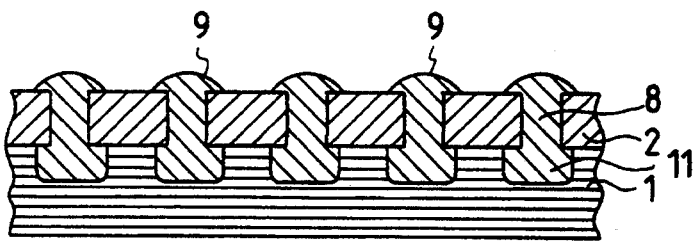
Figure 3F:
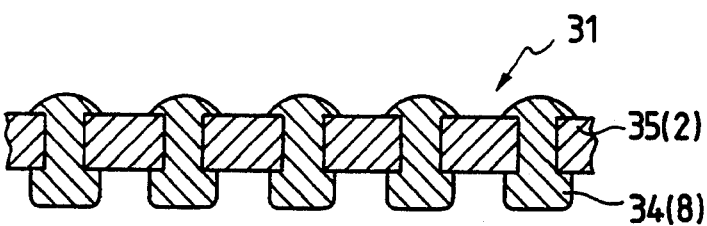

Next, by gold plating by use of the base member 1 as the common electrode, an electroconductive material 8 comprising gold is filled into the pores 6, the holes 11 (FIG. 3E). In this case, filling of the electroconductive material 8 is done until protruded from the upper surface of the insulating layer 2, and the protruded portions become gold bumps 9. The lower portions of the electroconductive material 8 filled becomes gold bumps 10 corresponding to the shape of the holes 11. Finally, by use of an etchant which will not etch the insulating layer 2 and the electroconductive material 8, the base member 1 is etched away to prepare an electrical connecting member 31 constituted of the holding member 35 and the electroconductive member 34 (FIG. 3F). Also in the electrical connecting member thus prepared, as described in the second example, the electroconductive member 34 will not be dropped off from the holding member 35, and when connected to electrical circuit parts, no defective connection accompanied with drops-off of the electroconductive member will be generated. Also, in the second example, sufficient amount of gold bump protruded can be obtained even if the electroconductive member pitch may be minimum (about 30μm).

FIGS. 4A–4G are schematic sectional views showing the preparation steps of the fourth example according to the present application.

Figure 4A:
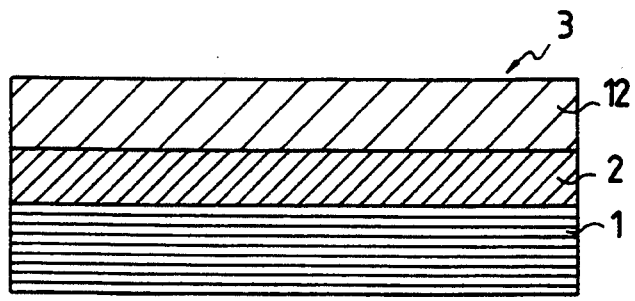
FIGS. 4A–4G are schematic illustrations showing the preparations steps in the fourth example of the present invention.

In this example, on the upper surface of the insulating layer 2 which becomes the holding member, a layer separate from the insulating layer is provided, and the shape of the upper protruded portion of the electroconductive material is defined by the layer. First, a matrix 3 comprising an insulating layer 2 comprising a polyimide resin laminated on one surface of a base member 1 comprising copper, and further a resist 12 laminated on one surface of the insulating layer 2 is prepared (FIG. 4A). The resist layer 12 comprises a material different from the insulating layer 2 (polyimide resin), which is a material more rapid in chemical etching rate than the polyimide resin. The insulaitng layer 2 and the base member 1 may be laminated by vapor,deposition of the metal material of the base member 1 onto the insulating layer 2, or alternatively by plating or by use of the both methods in combination. Also, the polyimide resin for formation of the insulating layer 2 may be coated on one surface of the base member 1. For the lamination method of the resist layer 12 onto the insulating layer 2, any desired method may be employed which can give uniform film thickness, such as spinner, roll coater, etc.

Figure 4B:
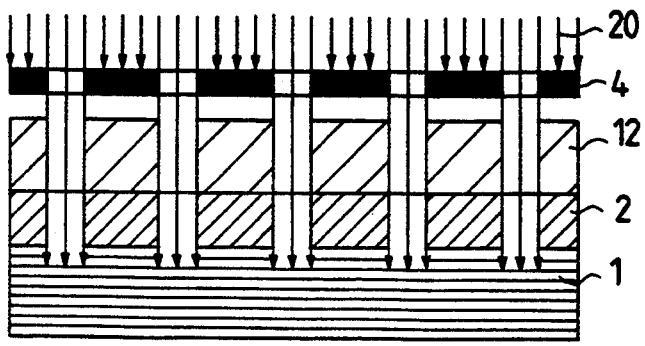

Next, with a posi-type mask 4 placed above the resist layer 12, KrF excimer laser which is a high energy beam 20 is irradiated from the resist layer 12 side on the matrix 3 (FIG. 4B). By the photoenergy of the excimer laser beam 20, the molecules of the resist layer 12 and the insulating layer 2 (polyimide resin) at the irradiated portion are cleaved off, whereby the holes 6 reaching the surface of the base member 1 are formed within the resist layer 12 and the insulating layer 2.

Figure 4C:
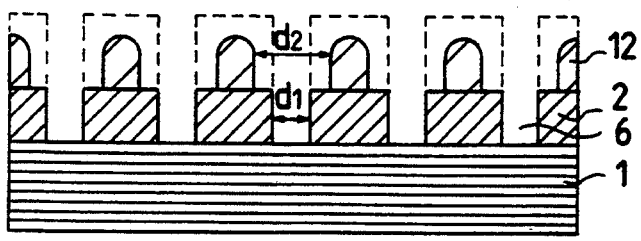

Next, by use of a low temperature resist peeling solution, chemical etching is applied on the resist layer 12 in the region larger than the diameter of the hole 6 and smaller than half of the interperipheral distance of the hole 6 to the adjoining hole 6, thereby retracting the whole portion of the resist 12 exposed (FIG. 4C). By such chemical etching, the relationship between $d_1$ (diameter of the hole 6 in the insulating layer 2) and $d_2$ (the diameter of the hole 6 in the resist 12) becomes $d_1 < d_2$. The shape of the hole 6 in the resist 12 becomes the laterally directed type of the protruded shape of later gold bump. Accordingly, by controlling the thickness of the resist 12 and the etching amount of the chemical etching, the protruded shape of the electroconductive member in the electrical connecting member prepared can be determined.

Figure 4D:
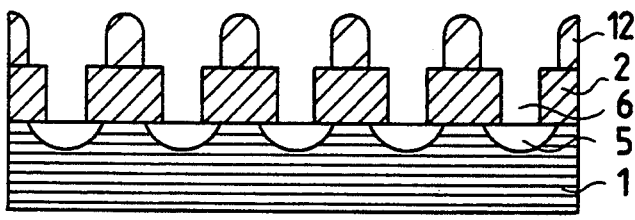

Then, on the surface of the base member 1 exposed, chemical etching is applied by use of an etchant which will not etch the insulating layer 2, the resist 12 to expand the holes 7 in the vertical direction and the lateral direction, thereby forming the concavities 5 (FIG. 4D). In this case, the size expanded in the lateral direction is made smaller than ½ of the interperipheral distance of the adjoining pore 6. By controlling thus the expansion in the lateral direction, the adjoining concavities 5 will not be communicated to each other. The diameter of the concavities 5 formed on the base member 1 becomes larger than that of the pores 6 formed through the insulating layer 2.

Figure 4E:
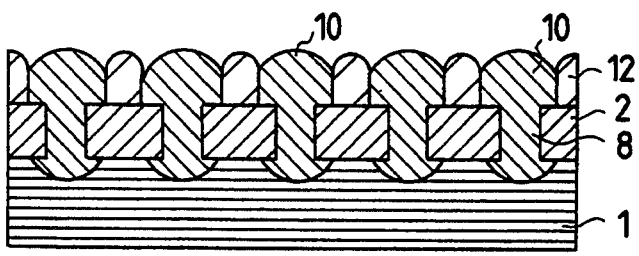
Figure 4F:
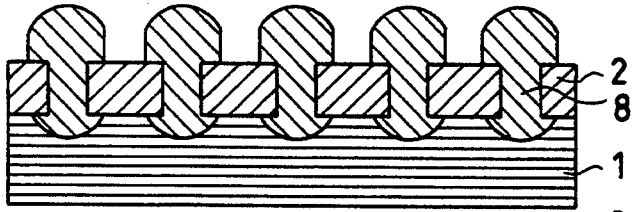
Figure 4G:
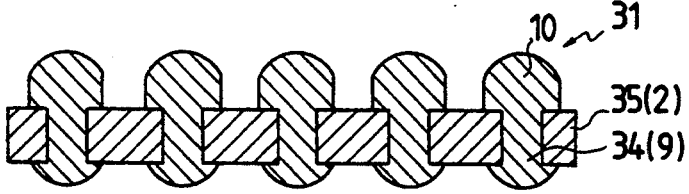

Next, by gold plating by use of the base member 1 as the common electrode, an electroconductive material 8 comprising gold is filled into the pores 6, the concavities 5 (FIG. 4E). In this case, filling of the electroconductive material 8 is done until at least protruded from the interface position between the insulating layer 2 and the resist 3, and the protruded portion becomes gold bump 9. The remaining resist 12 is completely peeled off by use of a resist peeling liquid (FIG. 4F), the base member 1 is etched away by use of an etchant which will not etch the insulating layer 2 and the electroconductive material 8, to prepare an electrical connecting member 31 (FIG. 4G).

In this example, in the electrical connecting member 31 prepared, the electroconductive member 34 is gold and the holding member 35 a polyimide resin.

In the present example, the case of forming concavities by etching of the base member surface after retraction of the resist 12 by developing (etching) has been shown (FIGS. 4C and 4D), but the resist 12 may be also retracted after formation of the concavities by etching of the base member surface, and the both may be also etched at the same time by selection of a material or an etchant which can etch the both. However, in view of circulation efficiency of the etchant to the etching site, it is preferable to etch the base member surface after retraction of the resist 12.

FIGS. 5A–5F are schematic sectional views showing the preparation steps of the fifth example according to the present invention.

In this example, similarly as in the fourth example, the insulating layer 2 and the resist layer 12 are provided on the base member, and pores 6 reaching the surface of the base member 1 are formed by use of a high energy beam. Even after the surface of the base member 1 is exposed, irradiation of the excimer laser beam 20 is continued to remove a part of the base member 1, thereby forming the holes 7 communicated to the pores 6 to a predetermined depth. In this case, the depth of the holes 7 is controlled by controlling the pulse number corresponding to the irradiation energy per one pulse of the excimer laser beam 20 and the etching rate for the base member 1.

Next, similarly as in the fourth example, the resist 12 is developed to be retracted to form a type of the protruded shape of the later gold bump in the lateral direction.

Figure 5A:
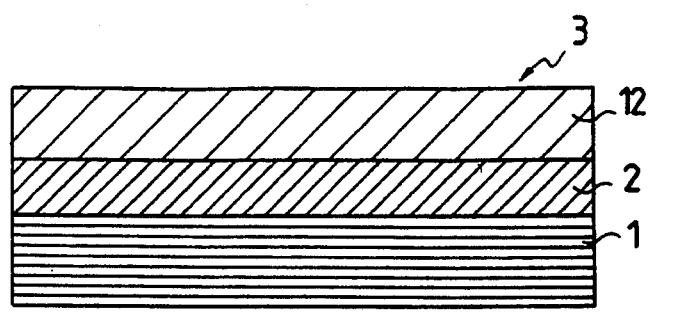
FIGS. 5A–5F are schematic illustrations showing the preparation steps in the fifth example of the present invention.
Figure 5B:
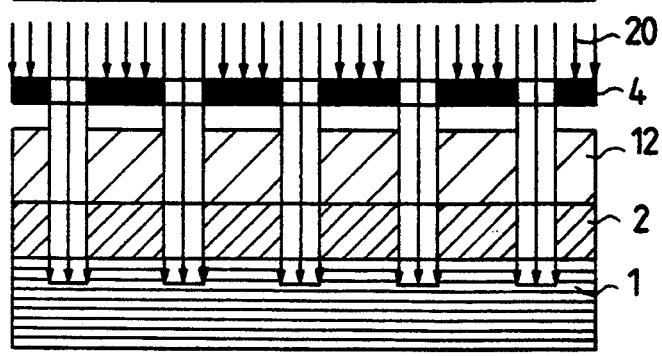
Figure 5C:
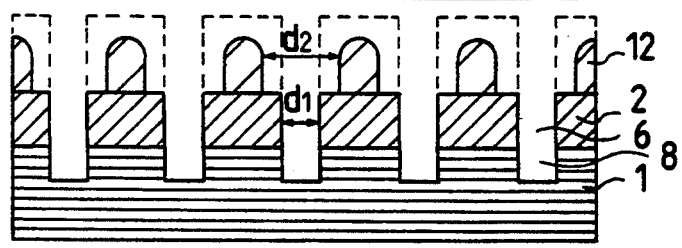
Figure 5D:
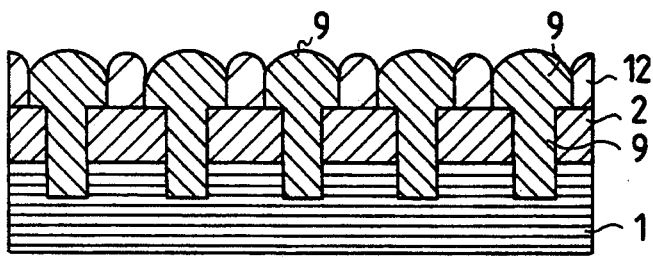
Figure 5E:
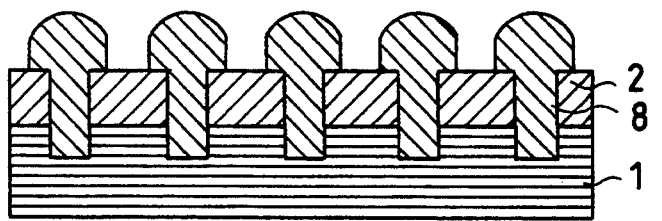
Figure 5F:
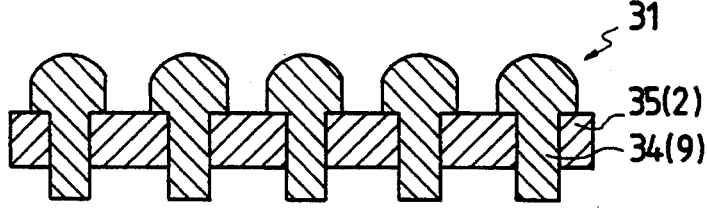

Next, by gold plating by use of the base member 1 as the common electrode, the electroconductive material 8 comprising gold is filled into the pores 6, and the holes 7 (FIG. 5D). In this case, filling of the electroconductive material 8 is done at least until protruded from the interface position between the insulating layer 2 and the resist 12, and the protruded portion becomes gold bump 9. The remaining resist 12 is completely peeled off by use of a resist peeling liquid (FIG. 5E), and the base member 1 is etched away by use of an etchant which will not etch the insulating layer 2 and the electroconductive material 8 to prepare an electrical connecting member 31 (FIG. 5F).

Figure 6A:
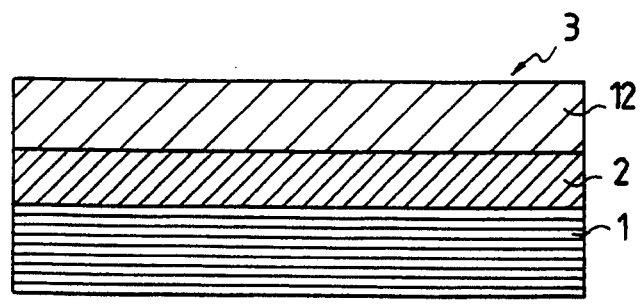
FIGS. 6A–6G are schematic illustrations showing the preparation steps in the sixth example of the present invention.
Figure 6B:
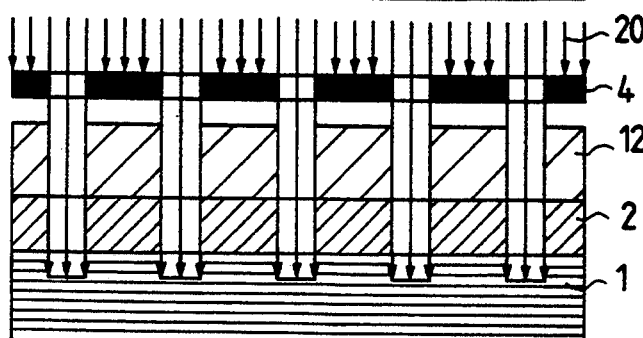
Figure 6C:
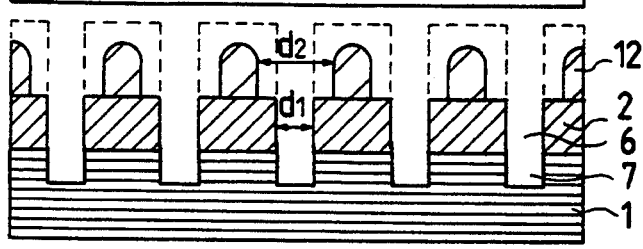
Figure 6D:
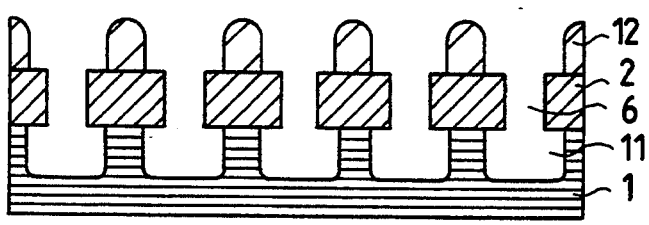

FIGS. 6A–6G are schematic sectional views showing the preparation steps of the sixth example of the present application. The steps shown in FIG. 6A to FIG. 6C are the same as shown in FIG. 5A to FIG. 5C in the fifth example as described above, and description thereof is omitted. After formation of the communicated pores 6 and holes 7 on the matrix 3 by irradiation of the excimer laser beam 20 (FIG. 6C), chemical etching is applied on the surface of the base member 1 exposed with an etchant which will not etch the insulating layer 2 and the resist 12, the holes 7 are expanded in the vertical direction and the lateral direction to make holes 11 (FIG. 6D). In this case, the size to be expanded in the lateral direction is made smaller then half of the interperipheral distance of adjoining pores 6. By controlling thus the expansion in the lateral direction, the adjoining holes 11 will not be communicated to each other. The diameter of the holes 11 formed on the base member 1 becomes larger than that of the pores 6 formed on the insulating layer 2. Since the holes 7 are formed downward by irradiation of the excimer laser beam 20 before chemical etching, the holes 11 formed after chemical etching can be made to have a shape expended larger in the downward direction rather than in the lateral direction.

Figure 6E:
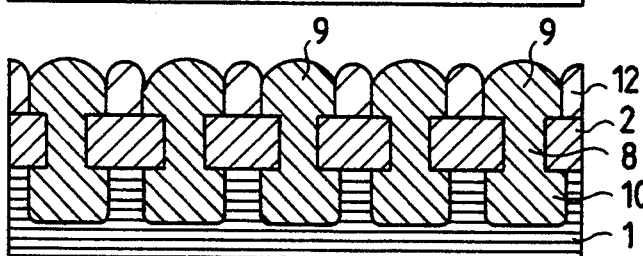
Figure 6F:
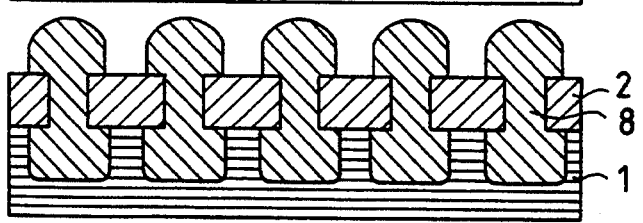
Figure 6G:
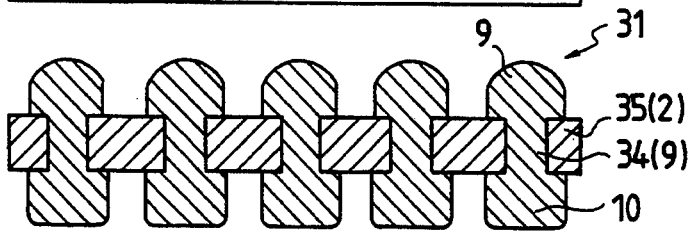

Next, by gold plating by use of the base member 1 as the common electrode, the electroconductive material 8 comprising gold is filled into the pores 6, the holes 11 (FIG. 6E). In this case, filling of the electroconductive material 8 is done until at least protruded from the surface position between the insulating layer 2 end the resist 12, end the protruded portion becomes gold bump 9. By the presence of the resist 12, growth of gold plating in the lateral direction is restricted, and gold bump 9 higher in the upward direction is formed. The lower portion of the electroconductive material 8 becomes the gold bump 10 matching to the shape of the hole 11. The remaining resist 12 is completely removed by use Of a resist peeling liquid (FIG. 6F), the base member 1 is etched away by use of an etchant which will not etch the insulating layer 2 and the electroconductive material 8 to prepare an electrical connecting member 31 (FIG. 6G).

The electrical connecting member thus prepared has larger diameter of the electroconductive member 34 (gold bumps 9, 10) exposed than that of the electroconductive member 34 (electroconductive material 8) filled in the holding member (insulating layer 2), and therefore the electroconductive member 34 will not be dropped off from the holding member 35, whereby no defective connection accompanied with dropoff of the electroconductive member is generated. Also, in the sixth invention, even if the electroconductive member pitch may become minimum (about 30 μm), sufficient protrusion of gold bump can be effected.

Also, in this example, similarly as described in the fourth example, either the step of retracting the resist 12 or formation of the concavity on the base member surface by etching may be performed first, or they may be practiced at the same time.

Figure 7A:
FIGS. 7A–7E are schematic illustrations showing the preparation steps in the seventh example of the present invention.
Figure 7B:
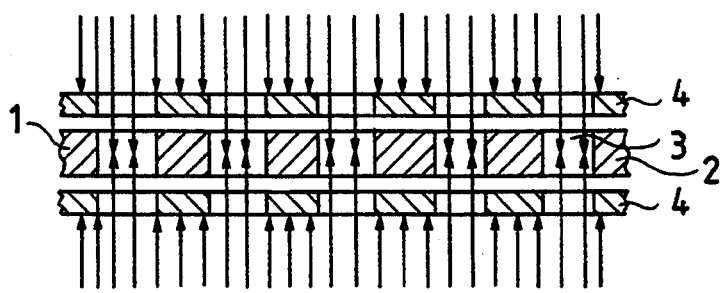

FIGS. 7A–7E show a schematic sectional views showing the preparation steps of the seventh example of the present invention. First, a holding member which is an electrical insulating material, for example, a polyimide resin film 2 is prepared (FIG. 7A), and a high energy beam such as excimer laser beam is projected through the post-type photomasks 4 at the corresponding positions at the same time to form pores 6 perforated through the polyimide resin film 2 (FIG. 7B).

Figure 7C:
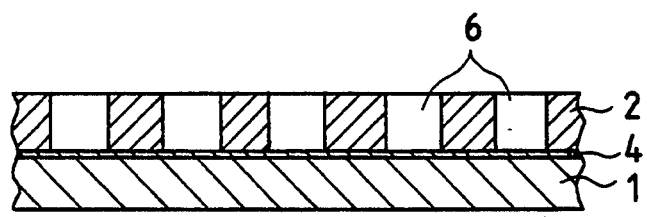
Figure 7D:
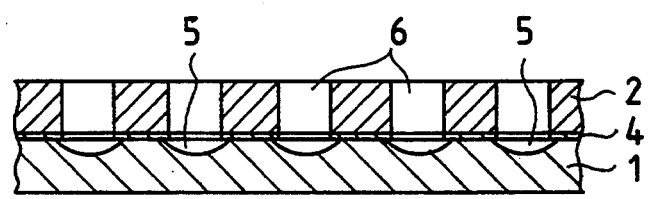

Next, the polyimide resin film 2 having the pores 6 perforated therethrough is plastered onto one surface of a metal foil 1 made of Cu as the base member by use of an adhesive 14 (FIG. 7C), and then the adhesive 14 existing at the bottom of each pore 6 is etched away to have the surface of the metal foil 1 exposed, and subsequently a part of the surface of the metal foil 1 is etched to form the concavities 5 (FIG. 7D).

The diameter of the concavity 5 is set so as to remain within the range larger than the diameter of the pore 6, and yet smaller than the interperipheral distance of adjoining pores 6.

Figure 7E:
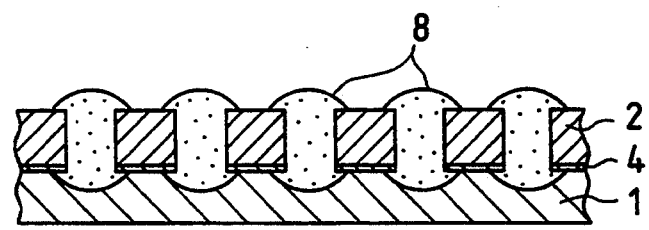

By gold plating by use of the metal foil 1 as the common electrode, the gold 8 which is the electroconductive material is filled into the pores 6, the concavities 5, and also gold plating is continued so that the gold 8 may be raised up higher than the surface of the polyimide resin film 2 (FIG. 7E).

In place of the plating method, the CVD method, etc. may be also employed.

Finally, the metal foil 1 is removed by etching with an etchant which etches, for example, Cu, etc. constituting the metal foil 1 but does not etch gold and the polyimide resin, and subsequently the adhesive 14 is removed to prepare an electrical connecting member 31 of which the electroconductive member 34 is constituted of gold and the holding member 35 of a polyimide resin.

Having described in this example about the case of projecting a laser beam through the photomask at the corresponding positions from the both surfaces of the polyimide resin film 2 at the same time in the step of perforating pores 6 through the polyimide resin film 2 as shown in FIG. 7B, in place thereof, the laser beam may be projected through the photomask 4 from one side of the polyimide resin film 2 to perforate first pores 6a with a depth corresponding to approximately ½ of the thickness of the polyimide resin film 2 (FIG. 8A), then reverse the polyimide resin film 2 and project similarly the laser beam through the photomask 4 at the position corresponding to the pores 6a (FIG. 8B) to perforate the pores 6.

Of course, the laser beam may be also projected to pass through the polyimide resin film 2 from one surface side to the opposite surface side, but since there is a fear that the diameter of the pores 6 may change in the thickness direction of the polyimide resin film 2, it is desirable to perforate holes with a depth corresponding to approximately ½ of the respective thicknesses from the both surface sides of the polyimide resin film 2.

Figure 9A:
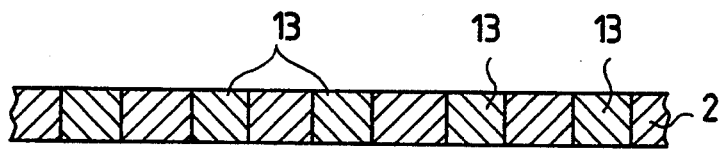
FIGS. 9A–9C are schematic illustrations showing temporary hole filling steps into the holes of the insulating layer which is the holding member.
Figure 9B:
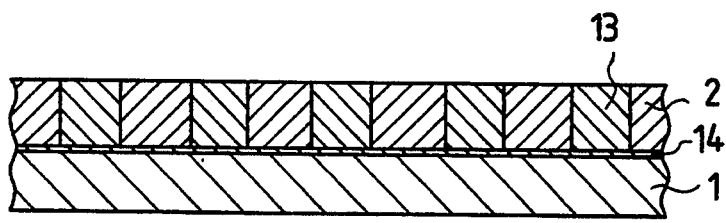
Figure 9C:
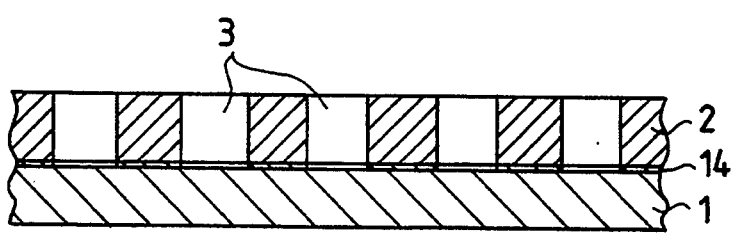

Having described in this Example as shown in FIG. 7C about the case of plastering the polyimide resin film 2 perforated with the pores 6 as such onto the surface of the metal foil 1 which is the base member with the adhesive 14, in place thereof, after perforation of the pores 6 in the polyimide resin film 2, a material 13 with different etching rate from the polyimide resin may be filled into the pores 6 to fill the pores 6 (FIG. 9A), the polyimide resin film 2 may be plastered onto the metal foil 1 with the adhesive 14 (FIG. 9B), and thereafter the adhesive 14 exposed within the material 13 and the pores 6 may be etched away (FIG. 9C), followed by etching of a part of the metal foil 1 exposed within the pores 6 to form the concavities 5. Other steps are substantially the same as in the case of the example shown in FIGS. 7A–7E, and description thereof is omitted.

In such example, since there is no anxiety of penetration of the adhesive 14 into the pores 6 when the polyimide resin film 2 is plastered with the metal foil 1, there is a further advantage that the fear of occurrence of variance in removal time of the adhesive 14 within the pores 6 due to the difference in amount of the adhesive 14 penetrated or make the shapes of the concavities formed on the metal foil 1 nonuniform can be avoided.

Figure 10A:
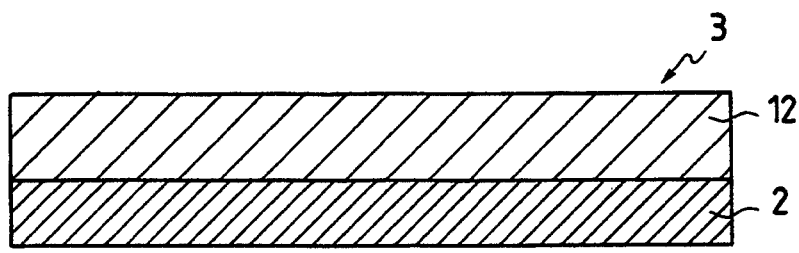
FIGS. 10A–10C are illustrations showing other steps in the seventh example of the present invention.

In this example, the example of plastering the polyimide resin film 2 perforated with pores 6 onto the base member 1 has been shown, but as shown in FIG. 10A, a matrix 3 having a layer different from the insulating layer capable of effecting developing selectively or more easily than the insulating layer (resist layer) may be also employed on the insulating layer which is the holding member. By performing hole opening on such matrix 3 with a high energy beam (FIG. 10B), retracting the resist 12 by chemical developing as shown in the fourth example to make larger the holes in the resist layer 12 than the hole diameter in the insulating layer, the protruded shape of the electroconductive member in the electrical connecting member can be defined.

Developing for retracting the resist layer may be performed either before or after adhesion of the matrix with opened holes onto the base member, but it is efficient to perform it simultaneously with etching to remove unnecessary adhesive after adhesion.

Figure 11A:
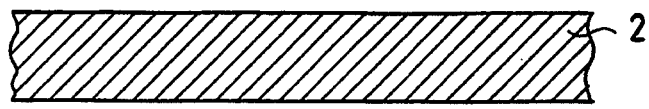
FIGS. 11A–11H are schematic illustrations showing the preparation steps in the eighth example of the present invention.

FIGS. 11A–11H are schematic sectional views showing the steps of the eighth example. First, the polyimide resin film 2 which is an electrically insulating material is prepared (FIG. 11A).

Figure 11B:
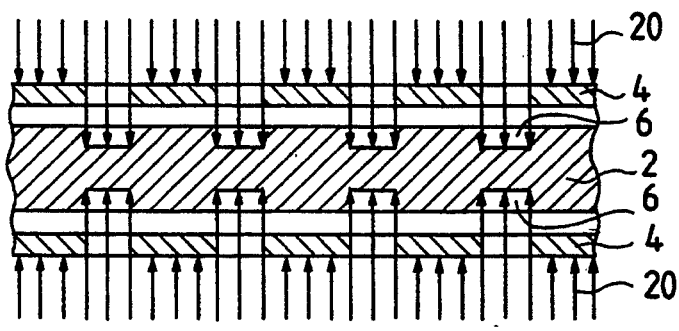

Similarly as shown in the seventh example, a plurality of pores 6 are formed through the polyimide resin film 2 (FIG. 11B).

In this case, since the excimer laser beam 20 is irradiated from the both surfaces on the same region, formation of pores 6 with finer diameter and deeper depth than in the case of irradiation from one direction can be formed. As the method for irradiating thus the excimer laser beam 20 with a desired size on the predetermined position of the polyimide resin film 2, for example, the polyimide film 2 may be mounted on an X-Y stage, and the movement amount of the X-Y stage and the timing of spot irradiation may be controlled. Alternatively, the excimer laser beam 20 may be made a parallel light, and irradiated through a mask 4 on the polyimide resin film 2.

Figure 11C:
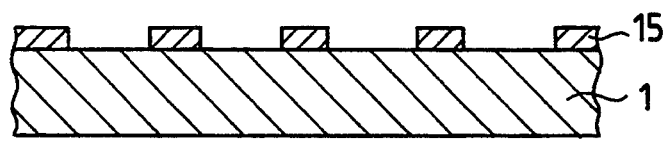
Figure 11D:
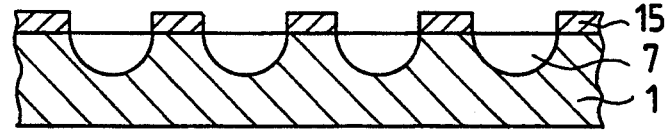
Figure 11E:

On the other hand, the copper foil 1 is coated with a resist 15 and then subjected to exposure, developing to a predetermined pattern (FIG. 11C). Next, with the resist 15 as the mask, the copper foil 1 is etched to form concavities 5 (FIG. 11D), and then the resist 15 is peeled off (FIG. 11E). In this case, the diameter of the concavities 5 is made larger than the diameter of the pores 6 and smaller than half of the interperipheral distance of adjoining pores 6. By doing so, in the electrical connecting member prepared, adjoining electroconductive members will not be conducted to each other, and there is no drop-off of the electroconductive member at all. The pitch of the concavities 5 formed is made equal to the pitch of the pores 6 formed through the polyimide resin film 2. Formation of the concavities 5 may be also performed by the punching treatment for the copper foil 1.

Figure 11F:
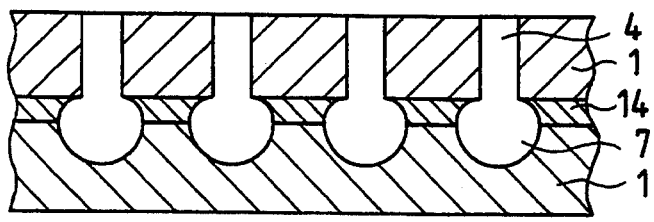

Next, the polyimide resin film 2 with a plurality of pores 6 formed therethrough and the copper foil 5 with a plurality of concavities 5 formed thereon are subjected to registration so that the centers of the respective pores 6 and the centers of the respective concavities 5 may coincident with one another, and plastered by use of an adhesive 14. Then, unnecessary adhesive 14 remaining in the pores 6 and the concavities 5 is etched away to make the corresponding pores 6 and the concavities 5 under completely communicating state (FIG. 11F).

Figure 11G:
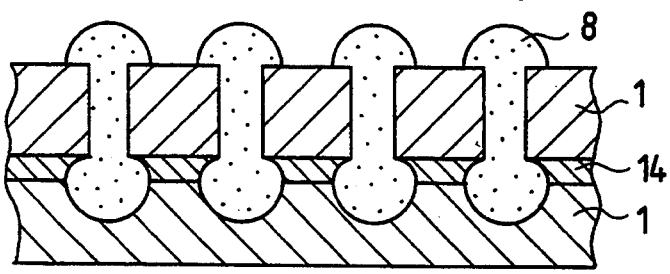
Figure 11H:
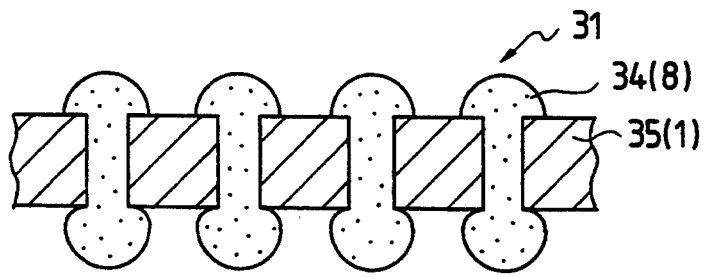

Next, by gold plating by use of the copper foil 1 as the common electrode, gold 8 is filled into the pores 6 and the concavities 5, and gold plating is continued until gold 8 is protruded from the surface of the polyimide resin film 2 to form an electroconductive member 34 (FIG. 11G). Finally, the copper foil 1 and the adhesive 14 are completely removed by etching by use of an etchant which etches copper and the adhesive 14 but does not etch the gold 8 and the polyimide resin to prepare an electrical connecting member 31 (FIG. 11H).

In the electrical connecting member 31 thus prepared, the gold 8 constitutes the electroconductive member 34, and the polyimide resin film 2 constitutes the holding member 35.

Figure 8A:
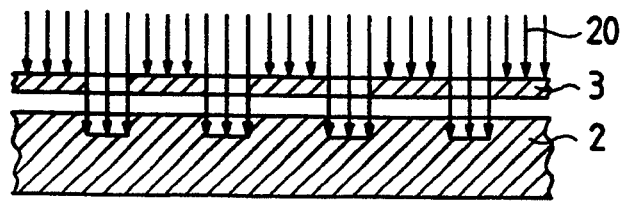
FIGS. 8A–8B are schematic illustrations showing another example of the hole opening method for opening holes through the insulating layer of the present invention.
Figure 8B:
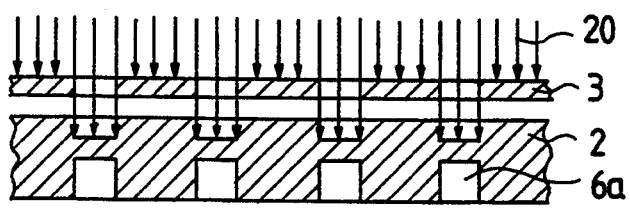

In this example, when holes are opened in the polyimide resin layer 2, the steps of irradiating a high energy from both sides are shown, but according to the method shown in FIGS. 8A and 8B, the thru-pores 6 may be formed by opening holes on each side one by one.

When concavity formation by etching of the base member is not done through the polyimide resin layer which is an insulating layer and becomes the holding member as in this example, the etchant can be circulated well to form the concavities with particularly good precision.

FIGS. 12A–12K are schematic sectional views showing the steps of the ninth example. In the ninth example, the steps in FIGS. 12A to FIG. 12E are entirely the same as the steps in FIGS. 11A to FIG. 11E, and therefore description thereof is omitted by attaching the same numerals to the same parts.

Figure 12A:
FIGS. 12A–12K are schematic illustrations showing the preparation steps in the ninth example of the present invention.
Figure 12B:
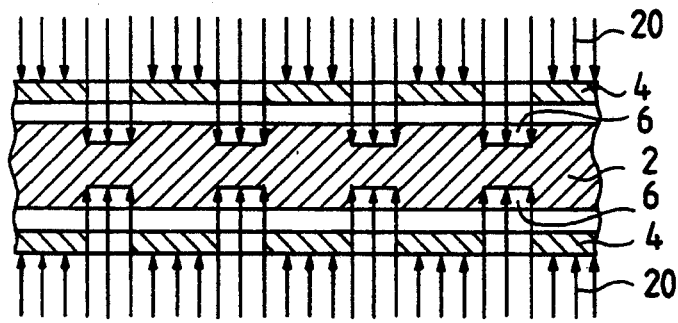
Figure 12C:
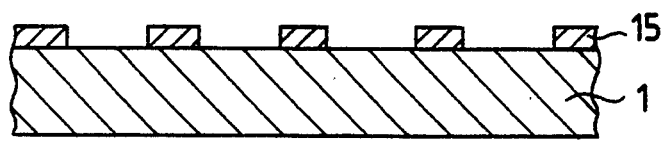
Figure 12D:
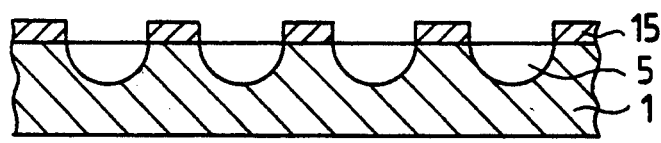
Figure 12E:
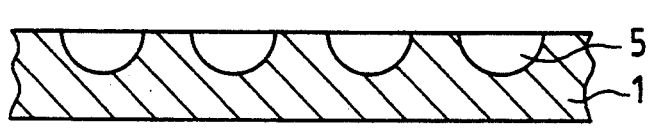
Figure 12F:
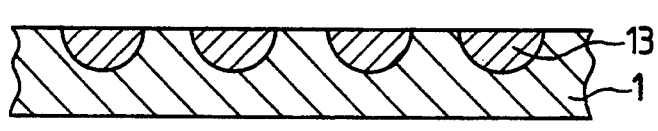
Figure 12G:
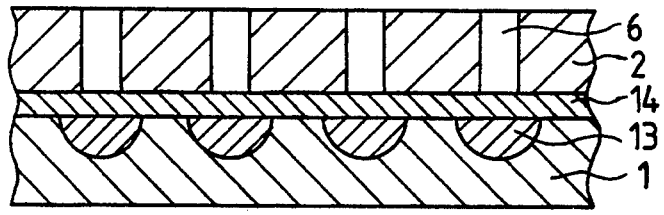
Figure 12H:
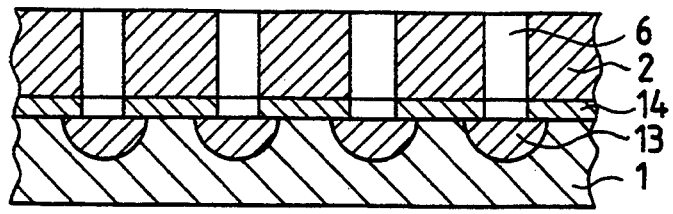

A soluble resin 13 is cast into the concavities 5 formed on the copper foil 1 which is the base member to fill the concavities 5 (FIG. 12F). Next, the polyimide resin film 2 of an insulating layer which becomes the holding member and the copper foil 1 are subjected to registration so that the centers of the respective pores 6 may coincident with those of the respective concavities 5, and plastered together by use of an adhesive 14 (FIG. 12G).

Figure 12I:
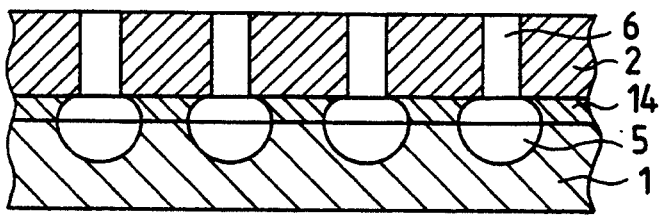
Figure 12J:
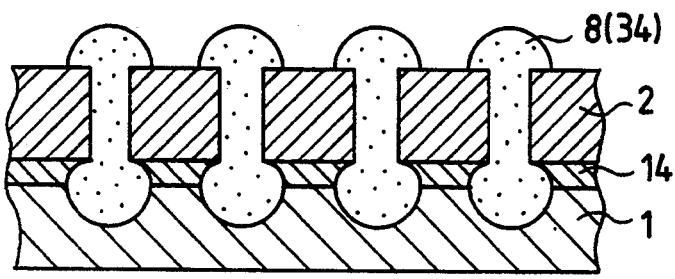
Figure 12K:
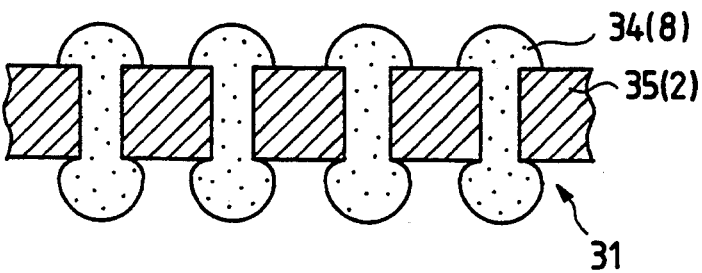

Next, after etching away the adhesive 14 exposed on the bottom of the pores 6 (FIG. 12H), the soluble resin 13 filling the concavities 5 is dissolved to form again the concavities 5 to make the pores 6 and the concavities 5 under completely communicated state (FIG. 12I). Similarly as in the seventh example, after filling of gold 8 into the pores 6 and the concavities 5 by gold plating (FIG. 12J), the copper foil 1 and the adhesive 14 are etched away to prepare an electrical connecting member 31 (FIG. 12K).

In this example, since the soluble resin 13 is filled in the concavities 5, the adhesive 14 will not be attached on the side surfaces of the concavities 5 or the adhesive 14 will not fill the concavities 5, whereby the adhesive 14 can be etched away stably. In the formation step of pores 6, the method as shown in FIGS. 8A and 8B may be also used as a matter of course.

Figure 13A:
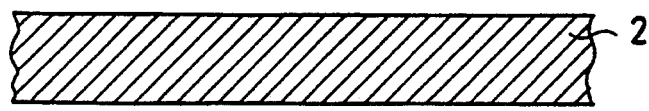
FIGS. 13A–13I are schematic illustrations showing the preparation steps in the tenth example of the present invention.
Figure 13B:
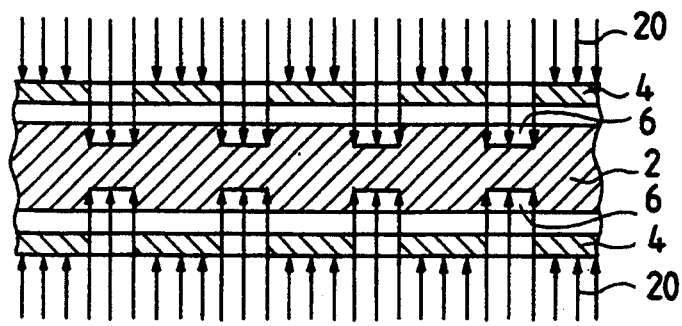
Figure 13C:
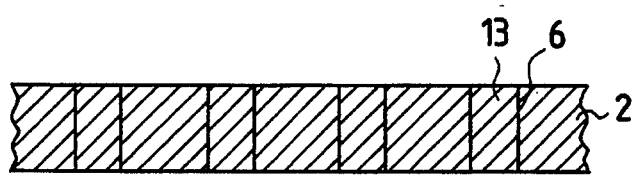
Figure 13D:
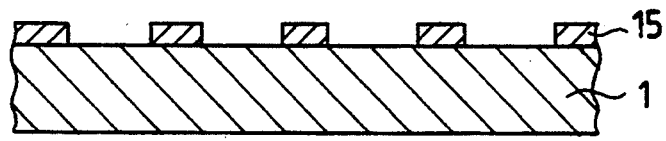

FIGS. 13A–13I schematic sectional views showing the steps of the tenth example of the present invention. Similarly as in the ninth example, the polyimide resin film 2 of an insulation layer which becomes the holding member is prepared (FIG. 13A), the excimer laser beam 20 is irradiated through masks 4 to form a plurality of pores 6 through the polyimide resin film 2 (FIG. 13B). Next, into the pores 6 formed in the polyimide resin film 2 is cast a soluble resin 13 to fill the pores 6 (FIG. 13C).

Figure 13E:

On the other hand, similarly as in Example 9, the resist 15 coated on the copper foil 1 which is the base member is exposed and developed (FIG. 13D), followed by etching of the copper foil 1 with the resist 15 as the mask to form concavities 5, and the resist 15 is peeled off (FIG. 13E). The relationship between the diameter end the formed pitch in the concavities 5 and pores 6 formed is the same as in the ninth example.

Figure 13F:
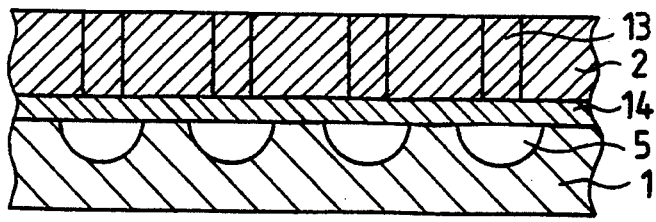
Figure 13G:
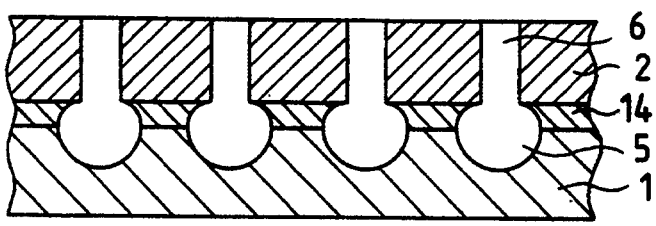
Figure 13H:
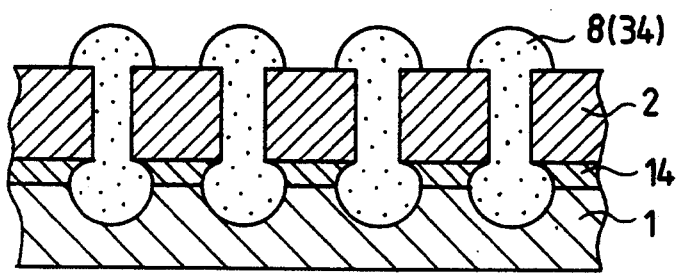
Figure 13I:
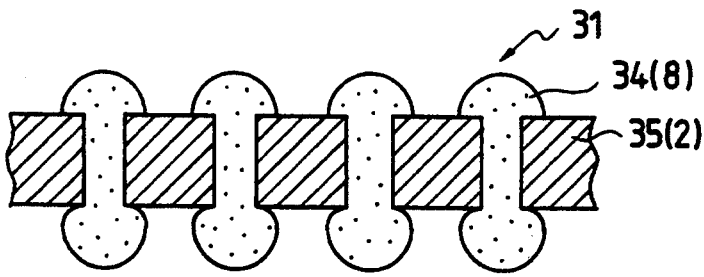

Next, the polyimide resin film 2 and the copper foil 1 are subjected to registration so that the centers of the respective pores 6 may coincide with those of the respective concavities 5, and then plastered by use of an adhesive 14 (FIG. 13F). Next, the soluble resin 13 filling the pores 6 is dissolved to form again the pores 6, and also unnecessary adhesive 14 is etched away to make the pores 6 and the concavities 5 under completely communicated state (FIG. 13G). Similarly as in the ninth example, after filling the pores 6 and the concavities 5 with gold 8 which is an electroconductive material by gold plating (FIG. 13H), the copper foil 1 and the adhesive 14 are etched away to prepare an electrical connecting member 31 (FIG. 13I).

In this example as described above, since the pores 6 are filled with the soluble resin 13, the adhesive 14 will not be adhered onto the inner wall surface of the pores 6 or no adhesive 14 will fill the pores 6, whereby the adhesive 14 can be etched away stably.

In the formation step of the pores 6, the method as shown in FIGS. 8A and 8B can be also employed as a matter of course.

By combining the ninth example as described above with the tenth example, it is evident that turnaround of the adhesive 14 can be further prevented.

Figure 14A:
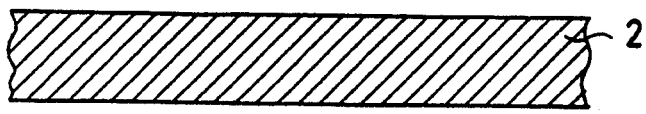
FIGS. 14A–14F are schematic illustrations showing the preparation steps in the eleventh example of the present invention.
Figure 14B:
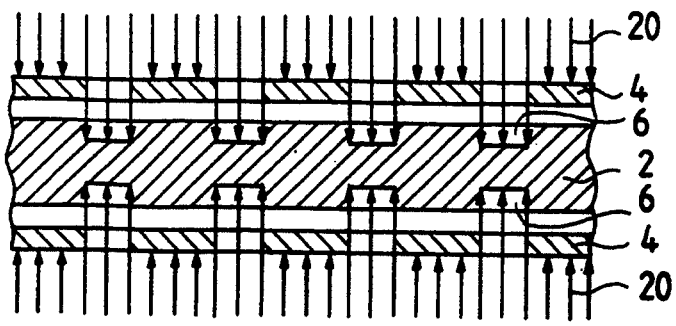

FIGS. 14A–14F are schematic sectional views showing the steps of the eleventh example. First, the polyimide resin film 2 which is an electrically insulating material is prepared (FIG. 14A). Similarly as in the seventh and the eighth examples, posi-type masks 4 with a predetermined pattern are placed on both surfaces of the polyimide resin film 2, and the excimer laser beam 20 which is a high energy beam such as KrF, ArF, etc. is irradiated. The bonds of the molecules of the polyimide resin at the portion irradiated by the photoenergy of the excimer laser beam 20 are cleaved to form a plurality of pores 6 (first holes) through the polyimide resin film 2 (FIG. 14B). In this case, since the excimer laser beam 20 is irradiated from the both surfaces on the same region, it is possible to form pores 6 which are finer in diameter and deeper than the case of irradiating from one side. As the method of irradiating thus the excimer laser beam 20 with a desired size at a predetermined position of the polyimide resin film 2, for example, the polyimide resin film 2 may be mounted on an X-Y stage, and the movement amount of the X-Y stage and the timing of spot irradiation may be controlled. Also, the excimer laser beam 20 may be made a parallel light, and irradiated through a mask 4 on the polyimide resin film 2.

Figure 14C:
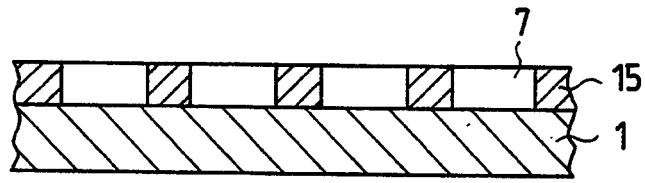

On the other hand, after coating of the copper foil 1 which is the second base member with a photosensitive resin (resist) 15 which becomes the first base member, it is subjected to exposure, developing to a predetermined pattern to form a plurality of holes 7 (second holes) (FIG. 14C). In this case, the diameter of the holes 7 is made larger than the diameter of the holes 4 formed in the polyimide film 2, and smaller than half of the interperipheral distance of the pores 6. By doing so, in the electrical connecting member prepared, the adjoining electroconductive members will not be conducted to each other, and yet there is no drop-off of electroconductive member. The pitch of the holes 7 formed is made equal to that of the pores 6 formed in the polyimide resin film 2.

Figure 14D:
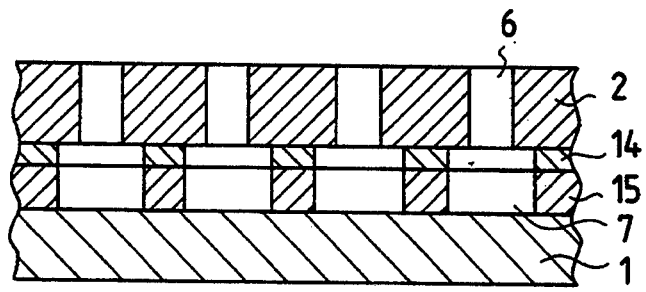

Next, the polyimide resin film 2 having a plurality of pores 6 formed and the resist 15 having a plurality of holes 7 formed are subjected to registration so that the centers of the respective pores 6 may coincide with the respective holes 7, and plastered together by use of an adhesive 14. Then, unnecessary adhesive 14 remaining in the pores 6 and the holes 7 is removed to make the corresponding pores 6 and the holes 7 under the completely communicated state to have the copper foil 1 exposed (FIG. 14D).

Figure 14E:
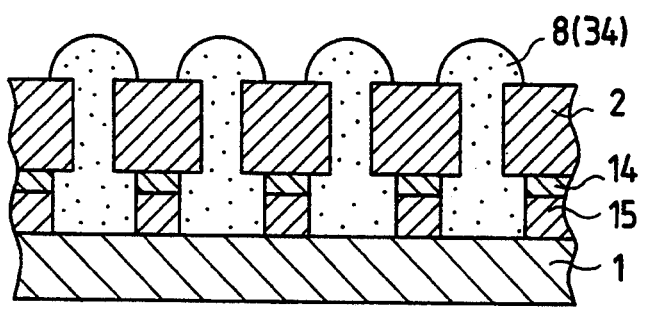
Figure 14F:
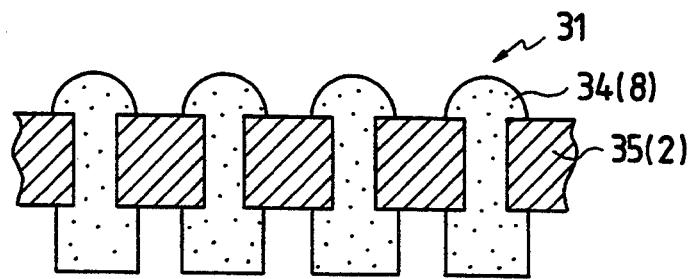

Next, the pores 6 and the holes 7 are filled with gold 8 by gold plating by use of the copper foil 1 as the common electrode 1, and gold plating is continued until the gold 8 is protruded from surface of the polyimide resin film 2 to form an electroconductive member 34 (FIG. 14E). Finally, the copper foil 1, the resist 15 and the adhesive 14 are completely removed by etching by use of an etchant which etches copper, the resist 15 and the adhesive 14 but does not etch gold 8 and the polyimide resin to prepare an electrical connecting member 31 (FIG. 14F).

In the electrical connecting member 31 thus prepared, the gold 8 constitutes the electroconductive member 34, and the polyimide resin film 2 constitute the holding member 35.

Also, in this example, when a plurality of pores 6 are formed in the polyimide resin 2, as shown in FIGS. 8A and 8B, a high energy beam may be irradiated on each side one by one to form pores 6 therethrough.

Figure 15A:
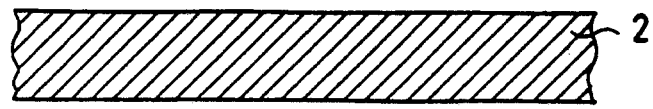
FIGS. 15A–15H are schematic illustrations showing the preparation steps in the twelfth example of the present invention.
Figure 15B:
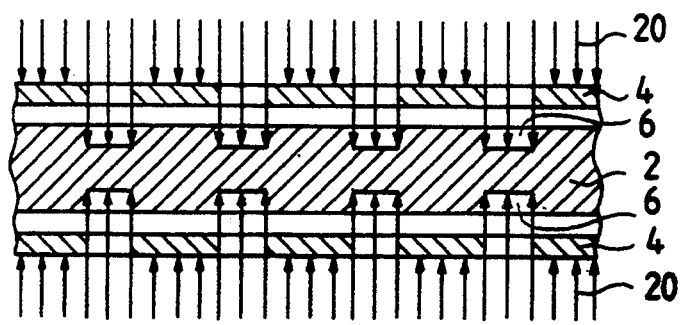
Figure 15C:
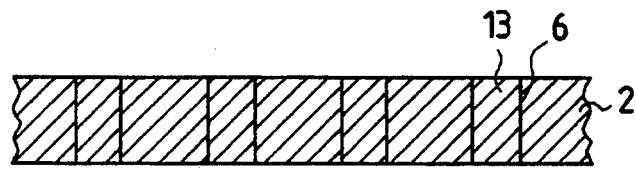

FIGS. 15A–15H are schematic sectional views showing the steps of the twelfth example of the present invention. Similarly as in the eleventh example, the polyimide resin film 2 is prepared (FIG. 15A), and the excimer laser beam 20 is irradiated through the masks 4 to form a plurality of pores 6 in the polyimide resin film 2 (FIG. 15B). Next, the soluble resin 13 is cast into the pores 6 to fill the pores 6 (FIG. 15C).

Figure 15D:
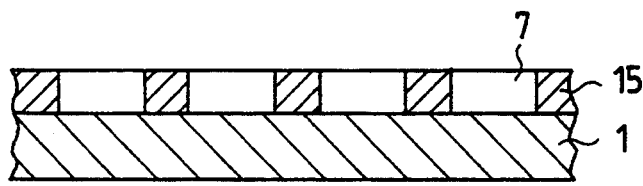

On the other hand, similarly as in the eleventh example, the resist 15 coated on the copper foil 1 is subjected to exposure, developing to form a plurality of holes 7 (FIG. 15D). The relationships between the diameter and the formed pitch in the holes 7 and the pores 6 are the same as in the fourteenth example.

Figure 15E:
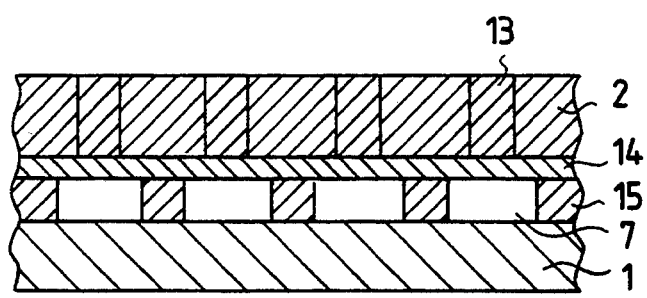
Figure 15F:
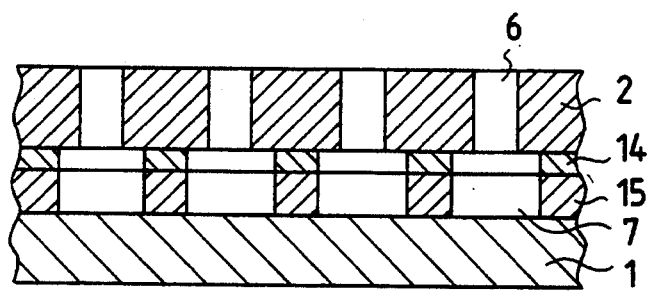
Figure 15G:
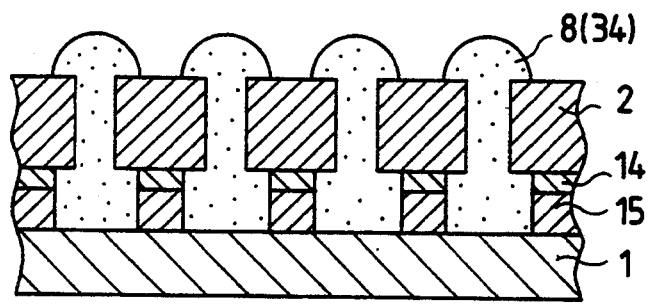
Figure 15H:
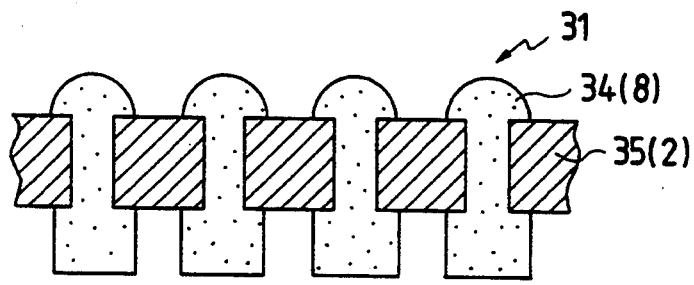

Next, the polyimide resin film 2 and the resist 15 are subjected to registration so that the centers of the respective pores 6 may be coincident with those of the respective holes 7, and plastered together by use of the adhesive 14 (FIG. 15E). Next, the soluble resin 13 filling the pores 6 is dissolved to form again the pores 6, thereby making the pores 6 and the holes 7 under the completely communicated state (FIG. 15F). Similarly as in the eleventh example, after filling gold 8 into the pores 6 and the holes 7 by gold plating (FIG. 15G), the copper foil 1, the resist 15 and the adhesive 14 are etched away to prepare an electrical connecting member 31 (FIG. 15H).

In this example as described above, since the soluble resin 13 is filled in the pores 6, and therefore the adhesive 14 will not be raised up on the side surface of the pores 6, or the popes 6 will not be filled with the adhesive 14, whereby the adhesive 14 can be etched away stably.

In the formation step of the pores 6, the method as shown in FIGS. 8A and 8B may be employed as a matter of course.

Figure 16A:
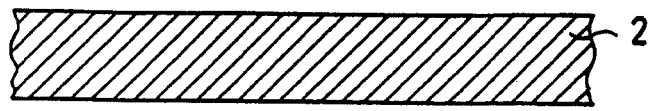
FIGS. 16A–16H are schematic illustrations showing the preparation steps in the thirteenth example of the present invention.
Figure 16B:
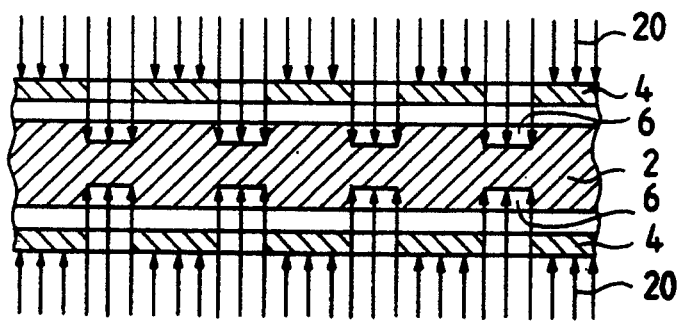
Figure 16C:
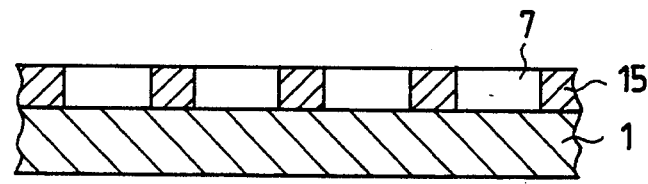

FIGS. 16A–16H are schematic sectional views showing the steps of the thirteenth example. In the thirteenth example, the steps in FIGS. 16A to 16C are entirely the same as the steps in FIGS. 14A to 14C show in the eleventh example, and therefore description thereof is omitted by attaching the same numerals to the same parts.

Figure 16D:
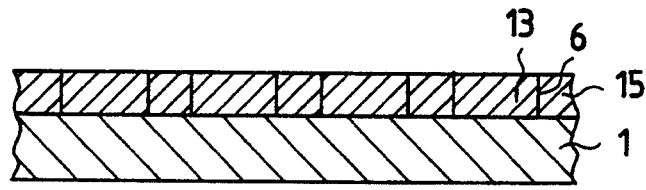
Figure 16E:
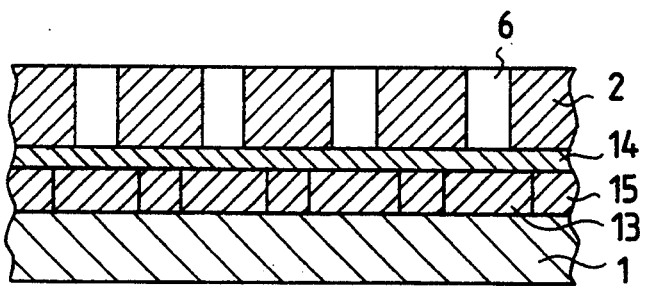

A soluble resin 13 is cast into the holes 7 formed in the resist 15 to fill the holes 7 (FIG. 16D). Next, the polyimide resin film 2 and the resist 15 are subjected to registration so that the centers of the respective pores 6 may coincident with those of the respective holes 7, and plastered together by use of an adhesive 14 (FIG. 16E).

Figure 16F:
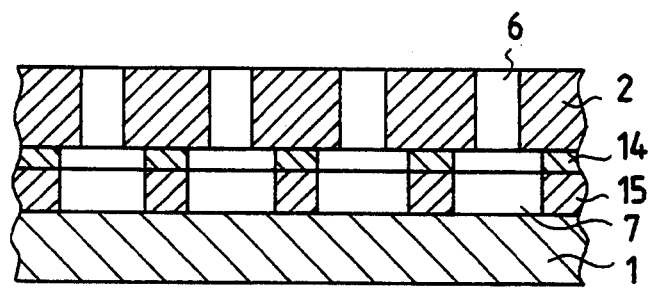
Figure 16G:
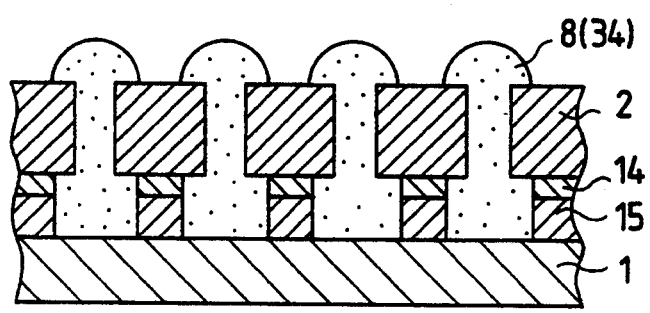
Figure 16H:
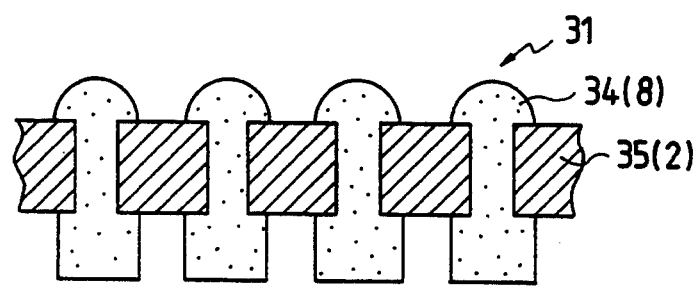

Next, after etching away the adhesive 14 exposed on the bottom of the pores 6, the soluble resin 13 filling the holes 7 is dissolved to form again the holes 7 to make the pores 6 and the holes 7 under completely communicated state (FIG. 16F). Similarly as in the fourteenth example, after filling of gold 8 into the pores 6 and the holes 7 by gold plating (FIG. 16G), the copper foil 1, the resist 15 and the adhesive 14 are etched away to prepare an electrical connecting member 31 (FIG. 16H).

In the thirteenth example, since the soluble resin 13 is filled in the holes 7 the adhesive 14 will not be attached on the inner side surfaces of the holes 7 or the adhesive 14 will not fill the holes 7, whereby the adhesive 14 can be etched away stably. Also, by combining the twelfth example as described above with the thirteenth example, it is evident that the turn-around of the adhesive 14 can be further prevented.

In the thirteenth example, in the formation step of the pores 6, the method as shown in FIGS. 8A and 8B can be employed as a matter of course.

Figure 17A:
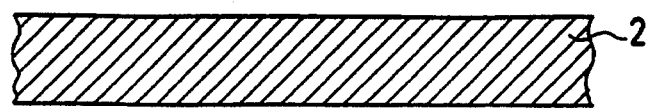
FIGS. 17A–17G are schematic illustrations showing the preparation steps in the fourteenth example of the present invention.
Figure 17B:
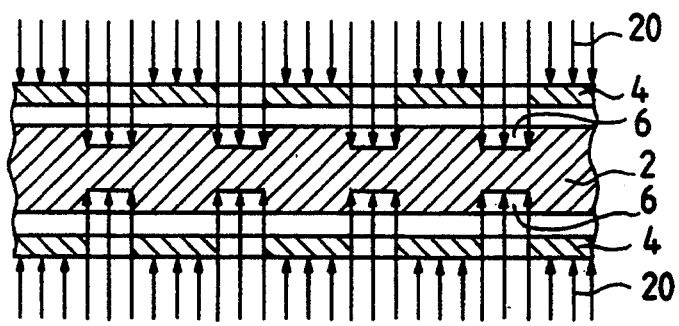

FIGS. 17A–17G are schematic sectional views showing the steps of the fourteenth example. Similarly as in the fourteenth example, the polyimide resin film 2 is prepared (FIG. 17A), the excimer laser beam 20 is irradiated through the masks 4 to form a plurality of pores 6 (first holes) in the polyimide resin film 2 (FIG. 17B).

Figure 17C:
Figure 17D:
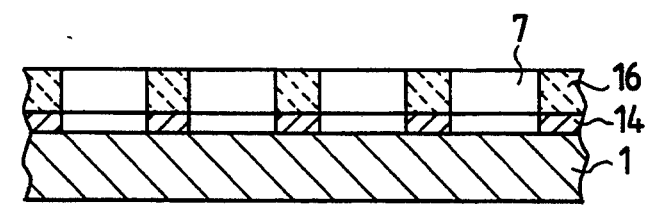

On the other hand, a metal foil 16 which is the first base member having a plurality of holes 7 (second holes) extending therethrough is prepared (FIG. 17C). The diameter of the holes 7 formed is made larger than the pores 6 formed in the polyimide resin film 2 and smaller than half of the interperipheral distance of adjoining pores 6, while the pitch of the holes 7 is made equal to that of the pores 6 formed in the polyimide resin film 2. The preparation method of such metal foil 16 may be by way of photolithography and etching, or alternatively by way of irradiation of laser beam such as hole working for the polyimide resin film 2. Next, the metal foil 16 and the copper foil 1 which is the second base member are plastered together by use of an adhesive 14, and unnecessary adhesive 14 is etched away so that no adhesive 14 may remain at the bottom of the holes (FIG. 17D).

Figure 17E:
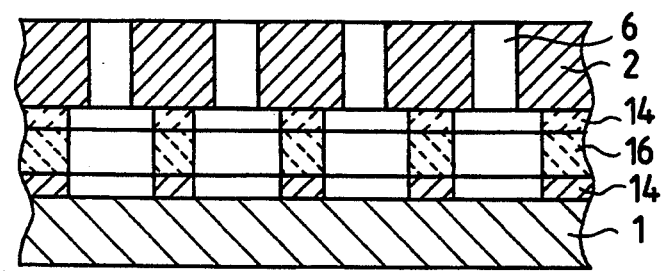

Next, the polyimide resin 2 having a plurality of popes 6 formed therein and the metal foil 16 having a plurality of holes 7 formed therein are subjected to registration so that the centers of the respective pores 6 may be coincident with those of the respective holes 7, and plastered together by use of the adhesive 14. The remaining unnecessary adhesive 14 is etched away to make the corresponding pores 6 and holes 7 under completely communicated state, thereby exposing the copper foil 1 (FIG. 17E).

Figure 17F:
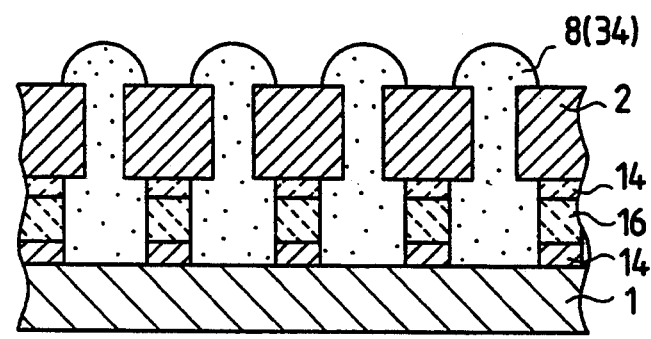
Figure 17G:
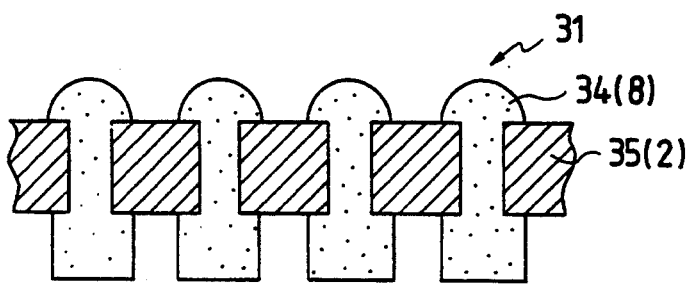
Figure 18A:
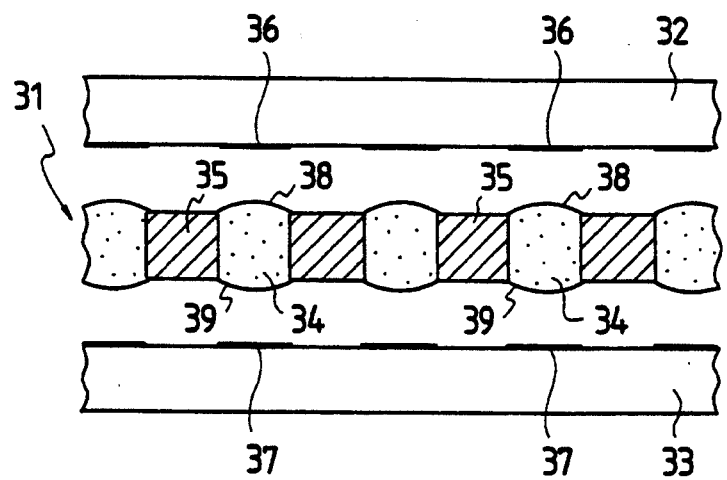
FIGS. 18A and 18B are schematic illustrations showing the electrical connection between electrical circuit parts by use of an electrical connecting member of the prior art.
Figure 18B:
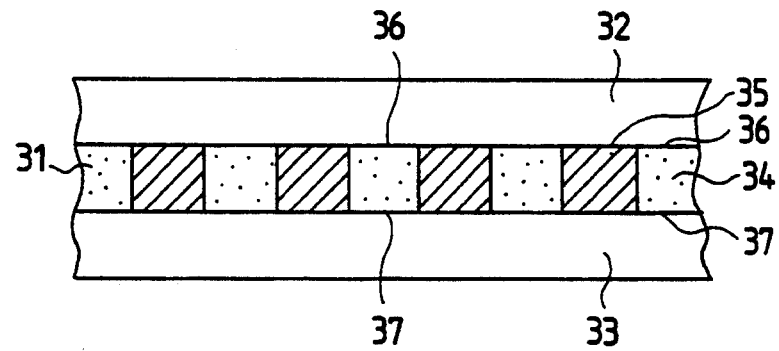
Figure 19A:
FIGS. 19A–19F are schematic illustrations of the steps of the process for preparing an electrical connecting member of the prior art.
Figure 19B:
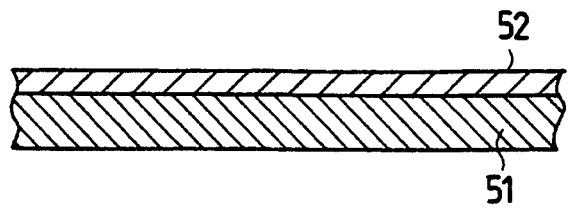
Figure 19C:
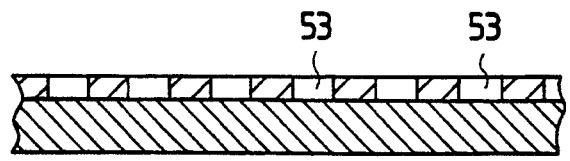
Figure 19D:
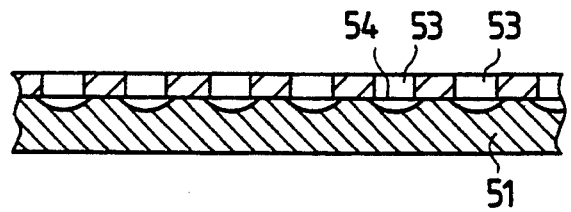
Figure 19E:
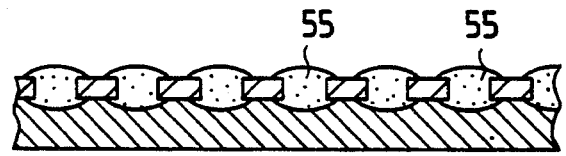
Figure 19F:
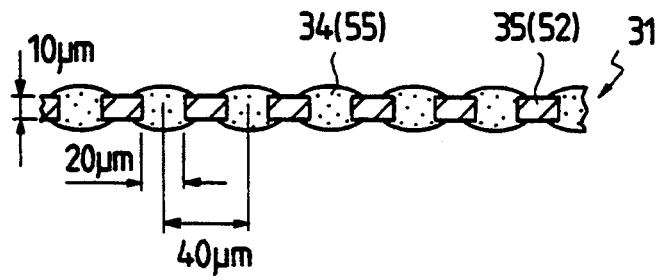

Next, gold 8 is filled into the pores 6 and the holes 7 by gold plating by use of the copper foil 1 as the common electrode, and gold plating is continued until the gold 8 is protruded from the surface of the polyimide resin film 2 to form an electroconductive member 34 (FIG. 17F). Finally, by use of an etchant which etches copper, the metal foil 16 and the adhesive 14 but does not etch the gold 8 and the polyimide resin, the copper foil 1, the metal foil 16 and the adhesive 14 are completely removed by etching to prepare an electrical connecting member 31 (FIG. 17G).

In this Example, when the twelfth example and/or the thirteenth example are applied, namely when a soluble resin is filled in the pores 6 and/or the holes 7 formed, the adhesive 14 can be removed stably as a matter of course.

Also, in the fourteenth example, in the formation step of the pores 6, the method as shown in FIGS. 8A and 8B may be employed as a matter of course.

Figure 10B:
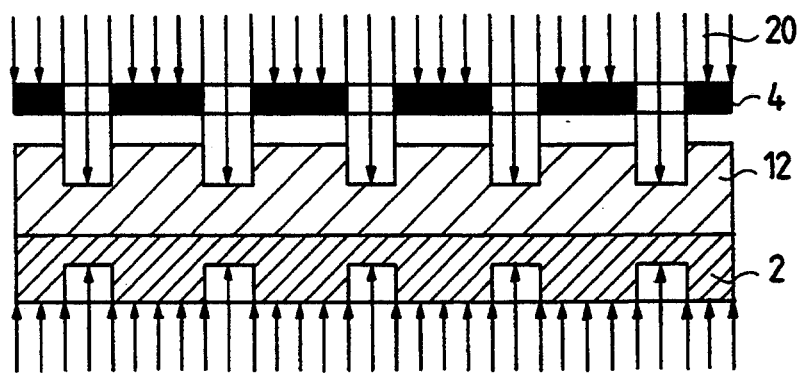
Figure 10C:
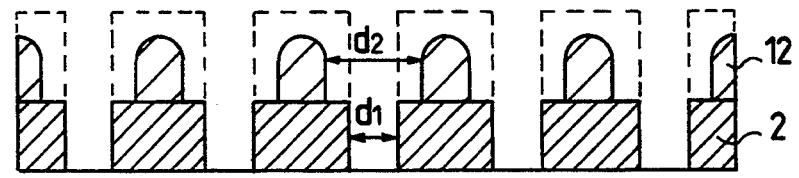

In the eighth to the thirteenth examples as described above, examples of the polyimide resin 2 perforated with holes bonded to the base member are shown, and by performing the steps as shown in FIGS. 10A–10C, the protruded shape of the electroconductive member in the electrical connecting member prepared can be defined. In FIGS. 10A–10C, developing for retracting the resist layer 12 may be practiced either before or after bonding of the matrix 4 with holes opened to the base member, but it is more efficient to perform such etching simultaneously with etching for removing unnecessary adhesive after bonding.

In the examples as described above, a polyimide resin which is an electrically insulating material has been employed as the holding member, but this is not particularly limitative, but epoxy resins, silicone resins, etc. may be also employed. Also, in these resins, one or plural kinds of inorganic materials, metal materials, alloy materials in any desired form such as powder, fiber, plate, bar, sphere, etc. may be also incorporated. Also, inorganic materials may be available, and inorganic materials containing one or plural kinds of organic materials, metal materials, alloy materials in any desired form such as powder, fiber, plate, bar, sphere, etc. may be employed. Specific examples of metal materials, alloy materials may include Au, Cu, Al, Be, Ca, Mg, Mo, Fe, Ni. Co, Mn, W, Cr, Nb, Zr, Ti, Ta, Zn, Sn, Pb-Sn, etc., and examples of inorganic materials to be contained may include ceramics such as $SiO_2$, $B_2O_3$, $Al_2O_3$, $Na_2O$, $K_2O$, CaO, ZnO, BaO, PbO, $Sb_2O_3$, $As_2O_3$, $La_2O_3$, $ZrO_2$, $P_2O_5$, $TiO_2$, MgO, SiC, BeO, BP, BN, AlN, $B_4C$, TaC, $TiB_2$, $CrB_2$, TiN, $Si_3N_4$, $Ta_2O_5$, etc., diamond, glass, carbon, boron, etc.

As the high energy beam, an excimer laser beam such as ArF, KrF, etc. has been employed, but this is not limitative, but those having an energy enough to remove the base member, insulating layer and the resist layer to desired sizes may be employed. Examples of them may also include $CO_2$, YAG, N, Ar, Kr laser beam, etc. In place of laser beam, it is also possible to use ion beam such as focused ion beam etching (FIBE), ion beam etching (IBE), sputtering, etc., electrical beam by discharging and others. However, use of ion beam requires placement of the sample in vacuum atmosphere, while discharge working can perform fine working relatively with difficulty. Thus, it is preferable to use a laser.

In the examples as described above, Cu has been employed as the material for the metal foil 1 as the base member, but this is not limitative, but metals or alloys such as Au, Ag, Be, Ca, Mg, Mo, Ni, W, Fe, Ti, In, Ta, Zn, Al, Sn, Pb-Sn, etc. Other than metals, alloys, those exhibiting electroconductivity may be available, such as materials comprising metal materials having one of both or organic materials or inorganic materials incorporated therein. Further, ceramics exhibiting superconductivity may be also available. However, since only the base member is selectively removed by etching in the final step, the material of the electroconductive member 34 and the material to be used for the base member are required to be different from each other.

Further, as the material for the electroconductive member 34, gold has been employed, but in place thereof, metal single substances or alloys thereof may be also employed, such as Cu, Ag, Be, Ca, Mg, Mo, Ni, W, Fe, Ti, In, Ta, Zn, Al, Sn, PbSn, etc. The cross-sectional shape of the electroconductive member 34 can be made circular, square and other shapes, but for the purpose of avoiding excessive concentration of stress, a shape without corner is desirable.

The electroconductive member 34 is not required to be arranged vertically into the holding member 35, but it may be oblique from one surface side of the holding member 35 to the other end of the holding member 35.

As the adhesive to be employed in the seventh example et. seq., as described above, there may be employed any one of thermoplastic adhesives such as vinyl chloride type, acrylic type, polyamide type, polyethylene type, etc., thermosetting adhesives such as phenol type, epoxy type, polyester type, etc. synthetic rubber type adhesives.

As the method for filling an electroconductive material, the plating method has been employed, but as other methods, selective growth by CVD (Chemical Vapor Deposition) may be also practiced. When, an electroconductive material is filled by the CVD method, the base member constituting the matrix is not required to comprise an electroconductive material.

The electrical connecting member prepared in the present invention has a plurality of electroconductive members exposed on a holding member comprising an electrical insulating material. Also, some have a wiring pattern present thereon. In that case, the wiring pattern may be present internally of the holding member, or alternatively present on one surface or both surfaces of the holding member. The individual electroconductive members equipped and the wiring pattern may be electrically connected or not. Further, such electrical connection may be done internally of the holding member, or on one surface or both surfaces of the holding member. The material of the wiring pattern is not limited to metal materials, but other electroconductive materials may be available. The end of the connection portion of the electroconductive member should be preferably in convex shape. The electrical connecting member may also comprise either one layer or a multi-layer of two or more layers.

The electroconductive member 34 is not required to be arranged vertically into the holding member 35, but may be oblique from one surface side of the holding member 35 to the other surface side of the holding member 35. The thickness of the electroconductive member 34 is not particularly limited. The exposed portion of the electroconductive member 34 may be made coplanar with the surface of the holding member 35, or alternatively protruded from the surface of the holding member 35. However, for ensuring reliability by effecting connection with the connecting portion of electrical circuit parts stably, the electroconductive member 34 connected with the connecting portion of electrical circuit parts should be stably protruded from the holding member 35.

And, if the size of at least a part of the protruded portion of the electroconductive member 34 with a shape protruded from the holding member 35 is larger than the diameter of the pore formed in the holding member, the electroconductive member can be held without drop-off by the holding member.

This applies similarly with the shape of the concavities provided on the base member for forming protruded portions, and the size of at least a part of the concavities should be the size of at least a part of the concavities should be preferably larger than the diameter of the above-mentioned holes as a matter of course. At this time, the diameters of the protruded portions and the concavities are required to be made smaller than ½ of the interperipheral distance of adjoining pores 6.

According to the preparation process of the present invention, a plurality of holes are formed by irradiation of a high energy beam on an electrically insulating material which is the holding member, and therefore an electrical connecting member equipped with electroconductive members at a high density with narrow pitch could be prepared while maintaining insulation between adjoining electroconductors.

According to the preparation process of the present invention, the shapes of the holes to be formed in the holding member are uniformized, and irrespectively of whether the film thickness is large or small, or whether the hole diameter is large or small, an electrical connecting member with a high aspect ratio can be prepared, whereby uniformization of the electroconductive member shapes could be effected, and stabilization of the characteristics as well as improvement of production yield could be effected.

In the present invention, the material for the electrically insulating material need not be restricted to photosensitive resins, but even resins completed of curing reaction can be used to make the width of the material selection larger. Also, as the holding material, not only resins but also inorganic materials can be used according to similar steps to prepare an electrical connecting member. Since the material can be also freely selected, the thickness of the holding member can be designed freely, whereby it is possible to provide an electrical connecting member in conformity with electrical circuit parts. Further, the steps can be simplified to great extent than in the case of preparing an electrical connecting member by use of the photosensitive resin of the prior art, and the cost can be reduced to great extent.

Further, holes are opened in the insulating layer which is the holding member by a high energy beam and the surface of the exposed base member is applied with chemical etching to expand the diameter of the holes at the bottom, and therefore an electrical connecting member equipped with electroconductive members with the diameter of the portions exposed from the holding member larger than the diameter at the portion in the holding member can be prepared, whereby drop-off of the electroconductive member filled could be completely prevented.

Further, when holes are opened also in a part of the base member together with the insulating layer by a high energy beam, particularly the protruded height of electroconductive members could be taken sufficiently without impairing high density.

When concavities for formation of protruded portions of electroconductive members are provided on the base member surface or holes for formation of protruded portions of electroconductive members are provided on the base member before bonding with an electrically insulating layer which becomes the holding member, the shapes of the protruded portions could be defined regardless of the thickness of the insulating layer or the size of the holes opened in the insulating layer. By doing so, the protruded portions can be made higher while maintaining the insulated state with other electroconductive members, and therefore high density connecting of electrical circuit parts to each other could be stably done.

Also in the case of providing members for defining the shapes of the protruded portions of electroconductive members on the insulating layer, there could be prepared an electrical connecting member which can provide good contact points in spite of high density and fine formation of wiring.

What is claimed is:

1. A process for preparing an electrical connecting member having a hole with a high aspect ratio to be filled with an electroconductive member of said electrical connecting member, said electrical connecting member having a holding member comprising an electrically insulating material and a plurality of electroconductive members equipped in said holding member in a state mutually insulated from each other, one end of each electroconductive member being exposed at one surface of said holding member, and the other end of each electroconductive member being exposed at the other surface of said holding member, said process comprising;

the step of forming a matrix having a state in which said holding member is in contact with a base member for supporting said holding member; and the step of irradiating a high energy beam on said matrix from said holding member side to remove an irradiated portion of said holding member to form a plurality of holes each having said high aspect ratio.

2. A process according to claim 1, wherein the step of forming said matrix is carried out by forming said holding member on said base member.

3. A process according to claim 1, further comprising the step of irradiating a high energy beam to remove a part of said base member subsequent to the step of irradiating a high energy beam to remove said holding member, thereby forming the holes.

4. A process according to claim 1 or 3, wherein the step of filling the electroconductive material which becomes said electroconductive member is carried out by forming said electroconductive member to the same level as or protruding from the surface of said holding member.

5. A process according to claim 4, wherein the size of at least a part of a protruding portion formed as protruding from the surface of said holding member is larger than the diameter of the hole formed through said holding member and smaller than half of an interperipheral distance of adjoining holes.

6. A process according to claim 1 or 3, further comprising the step of etching a part of the base member exposed by said plurality of holes formed through said holes prior to the step of filling said electroconductive material.

7. A process according to claim 6, wherein the size of at least a part of the holes formed through the base member by etching is larger than the diameter of the hole formed through said holding member and smaller than half of an interperipheral distance of adjoining holes.

8. A process according to claim 7, wherein the step of filling of electroconductive material which becomes said electroconductive member is carried out by forming said electroconductive member to the same level as or protruding from the surface of said holding member.

9. A process according to claim 8, wherein the size of a protruding portion formed as protruding from the surface of said holding member is larger than the diameter of the hole formed through said holding member and smaller than half of an interperipheral distance of adjoining holes.

10. A process according to claim 1, further comprising the step of filling an electroconductive material, which becomes the electroconductive member, into the plurality of holes.

11. A process according to claim 10, further comprising the step of removing the base member.

12. A process according to claim 1, wherein the high aspect ratio is equal to or greater than 1.

13. A process for preparing an electrical connecting member having a hole with a high aspect ratio to be filled with an electroconductive member of said electrical connecting member, said electrical connecting member having a holding member comprising an electrically insulating material and a plurality of electroconductive members equipped in said holding member in a state mutually insulated from each other, one end of each electroconductive member being exposed at one surface of said holding member, and the other end of each electroconductive member being exposed at the other surface of said holding member, said process comprising:

the step of forming a matrix having said holding member as a first insulating layer and a second insulating layer comprising a material different from the material of said first insulating layer in the order mentioned on a base member for supporting said holding member; and the step of irradiating high energy on said matrix from the side of said second insulating layer to remove the irradiated portion of said first and second insulating layers to form a plurality of holes each having a high aspect ratio.

14. A process according to claim 13, further comprising the step of performing etching to change the shape of the plurality of holes of the second insulating layer.

15. A process according to claim 14, further comprising the step of etching a part of the base member exposed by the plurality of holes through the holes.

16. A process according to claim 15, further comprising the step of filling an electroconductive material, which becomes the electroconductive member, into the plurality of holes, the holes being subjected to etching.

17. A process according to claim 16, further comprising the step of removing the second insulating layer and the base member.

18. A process according to claim 13, wherein the high aspect ratio is equal to or greater than 1.

19. A process for preparing an electrical connecting member having a hole with a high aspect ratio to be filled with an electroconductive member of said electrical connecting member, said electrical connecting member having a holding member comprising an electrically insulating material and a plurality of electroconductive members equipped in said holding member in a state mutually insulated from each other, one end of each electroconductive member being exposed at one surface of said holding member, and the other end of each electroconductive member being exposed at the other surface of said holding member, said process comprising:

the step of forming a matrix having a state in which said holding member is fixedly supported by a base member; and the step of irradiating a high energy beam on said matrix from said holding member side to remove an irradiated portion of said holding member side to form a plurality of holes each having said high aspect ratio.

20. A process according to claim 19, further comprising the step of filing an electroconductive material which becomes the electroconductive member, into the plurality of holes.

21. A process according to claim 20, further comprising the step of removing the base member.

22. A process according to claim 19, further comprising the step of irradiating a high energy beam to remove a part of said base member subsequent to the step of irradiating a high energy beam to remove said holding member, thereby forming the holes.

23. A process according to claim 19, wherein the step of filing the electroconductive material which becomes said electroconductive member is carried out by forming said electroconductive member to the same level as or protruding from the surface of said holding member.

24. A process according to claim 23, wherein the size of at least a part of a protruding portion formed as protruding from the surface of said holding member is larger than the diameter of the hole formed through said holding member and smaller than half of an interperipheral distance of adjoining holes.

25. A process according to claim 19, further comprising the step of etching a part of the base member exposed by said plurality of holes formed through said holes prior to the step of filing said electroconductive material.

26. A process according to claim 25, wherein the size of at least a part of the holes formed through the base member by etching is larger than the diameter of the hole formed through said holding member and smaller than half of an interperipheral distance of adjoining holes.

27. A process according to claim 26, wherein the step of filling of electroconductive material which becomes said electroconductive member is carried out by forming said electroconductive member to the same level as or protruding from the surface of said holding member.

28. A process according to claim 27, wherein the size of a protruding portion formed as protruding from the surface of said holding member is larger than the diameter of the hole formed through said holding member and smaller than half of an interperipheral distance of adjoining holes.

29. A process according to claim 19, wherein the step of forming said matrix is carried out by forming said holding member on said base member.

30. A process according to claim 19, wherein the hight aspect ratio is equal to or greater than 1.

31. A process according to claim 13, further comprising the step of irradiating a high energy beam to remove a part of said base member subsequent to said the matrix irradiating step.

32. A process according to claim 13, or 11, wherein the size of at least a part of the holes formed through the base member by etching is larger than the diameter of the holes formed through said holding member and smaller than half of an interperipheral distance of adjoining holes.

33. A process according to claim 32, wherein said further comprising the step of performing etching for changing the shape of said plurality of holes of said second insulating layer and wherein said step of etching at least a part the holes formed in said base member and said step of performing etching for changing the shape of the plurality of holes of said second insulating layer are carried out at the same time.

34. A process for preparing an electrical conducting member having a holding member comprising an electrical insulating material and a plurality of electroconductive members equipped in said holding member under a state of mutually insulated from each other, one end of said each electroconductive member being exposed at one surface of said holding member, and the other end of said each electroconductive member being exposed at the other surface of said holding member, said process having the following steps, namely:
   the first step of irradiating a high energy beam on said holding member to form a plurality of holes perforated therethrough;
   the second step of connecting said holding member to a base member for supporting said holding member by bonding;
   the third step of etching a part of the base member exposed by the plurality of holes formed through the holding member through said plurality of holes;
   the fourth step of filling an electroconductive material which becomes said electroconductive member into said plurality of holes and a part of the base member subjected to etching; and
   the fifth step of removing said base member.

35. A process according to claim 34, wherein said plurality of holes are formed by performing irradiation of said high energy beam on the both surfaces of said holding member at the same time.

36. A process according to claim 34, wherein said plurality of holes are formed by performing irradiation of said high energy beam on, one by one, the surfaces of said holding member.

37. A process according to any one of claims 34, 35 and 36, wherein the step of filling an electroconductive material which becomes said electroconductive member is carried out by forming said electroconductive member to the same level as or protruded from the surface of said holding member.

38. A process according to claim 37, wherein the size of at least a part of the protruded portions formed as protruded from the surface of said insulating layer is larger than the diameter formed through said holding member and smaller than half of the interperipheral distance of adjoining holes.

39. A process according to claim 38, the size of at least a part of the concavities formed on the base member is larger than the diameter formed through said holding member and smaller than half of the interperipheral distance of adjoining holes.

40. A process according to claim 39, wherein said second step is carried out by use of an adhesive.

41. A process according to claim 40, wherein the etching step is carried out for removing the adhesive before said third step.

42. A process for preparing an electrical conducting member having a holding member comprising an electrical insulating material and a plurality of electroconductive members equipped in said holding member under a state of mutually insulated from each other, one end of said each electroconductive member being exposed at one surface of said holding member, and the other end of said each electroconductive member being exposed at the other surface of said holding member, said process having the following steps, namely:
   the first step of irradiating a high energy beam on said holding member to form a plurality of holes extending therethrough;
   the second step of forming concavities on the surface of a base member for supporting said holding member at positions corresponding to the positions of the holes formed through said holding member;
   the third step of effecting registration between the holes formed through said holding member and the concavities of the base member, and connecting said holding member to said base member by bonding;
   the fourth step of filling an electroconductive material which becomes said electroconductive member into said holes and cavities; and
   the fifth step of removing said base member.

43. A process according to claim 42, wherein said plurality of holes are formed by performing irradiation of said high energy beam on the both surfaces of said holding member at the same time.

44. A process according to claim 42, wherein said plurality of holes are formed by performing irradiation of said high energy beam on, one by one, the surface of said holding member.

45. A process according to any one of claims 42, 43 and 44, wherein the step of filling the electroconductive material is carried out by forming said electroconductive member so as to have a surface coplanar with the surface of said holding member or a protruded portion protruded from the surface of said holding member.

46. A process according to claim 45, wherein the size of at least a part of the protruded portions formed as protruded from the surface of said holding member is larger than the diameter of the holes formed through said holding member and smaller than half of the interperipheral distance of adjoining holes.

47. A process according to claim 46, wherein the concavity formed on the base member is formed by etching, and the size of at least a part of the concavities is larger than the diameter of said plurality of holes formed through the holding member and smaller than half of the interperipheral distance of adjoining holes.

48. A process according to claim 47, wherein said second step is carried out by use of an adhesive.

49. A process according to claim 48, wherein the etching step is carried out for removing the adhesive before said third step.

50. A process according to claim 48, having the step of filling said plurality of holes formed through the holding member with a soluble material different from the material of said holding member before said third step.

51. A process according to claim 50, having the etching step for removing said soluble material and adhesive before said fourth step.

52. A process according to claim 48, having the step of filling the concavities formed on said base member with a soluble material different from the material of said holding material before said third step.

53. A process according to claim 52, having the etching step for removing said soluble material and adhesive before said fourth step.

54. A process according to claim 48, having the step of filling said plurality of holes formed through said holding member and the concavities formed on said base member with a soluble material different from the material of said holding member before said third step.

55. A process according to claim 54, having the etching step for removing said soluble material and adhesive before said fourth step.

56. A process according to claim 46, wherein the concavities formed on said base member are formed by bonding a metal foil having a plurality of holes perforated therethrough onto the base member, and the size of at least a part of said concavities is larger than the diameter of said plurality of holes and smaller than half of the interperipheral distance of adjoining holes.

57. A process according to claims 56, having the step of filling said plurality of holes formed through the holding member with a soluble material different from the material of said holding member before said third step.

58. A process according to claim 57, wherein said third step is carried out by use of an adhesive, said process having the etching step for removing said soluble material and a adhesive before said fourth step.

59. A process according to claim 56, having the step of filling the concavities formed on said base member with a soluble material different from the material of said holding member before said third step.

60. A process according to claim 59, wherein said third step is carried out by use of an adhesive, said process having the etching step for removing said soluble material and adhesive before said fourth step.

61. A process according to claim 56, having the step of filling said plurality of holes formed through said holding member and the concavities formed on said base member with a soluble material different from the material of said holding member before said third step.

62. A process according to claim 61, wherein said third step is carried out by use of adhesive, said process having the etching step for removing said soluble material and adhesive before said fourth step.

63. A process according to claim 46, wherein the concavity formed on said base member is formed by providing a photosensitive resin layer on the base member and subjecting it to patterning, and the size of at least a part of said concavities is larger than the diameter of said plurality of holes and smaller than half of the interperipheral distance of adjoining holes.

64. A process according to claim 63, having the step of filling said plurality of holes formed through the holding member with a soluble material different from the material of said holding member before said third step.

65. A process according to claim 64, having the etching step for removing said soluble material and adhesive before said fourth step.

66. A process according to claim 63, having the step of filling the concavities formed on said base member with a soluble material different from the material of said holding member before said third step.

67. A process according to claim 66, having the etching step for removing said soluble material and adhesive before said fourth step.

68. A process according to claim 63, having the step of filling said plurality of holes formed through said holding member and the concavities formed on said base member with a soluble material different from the material of said holding member before said third step.

69. A process according to claim 68, having the etching step for removing said soluble material and adhesive before said fourth step.

70. A process for preparing an electrical connecting member having a holding member comprising an electrically insulating material and plurality of electroconductive members equipped in said holding member under the state mutually insulated from each other, one end of said each electroconductive member being exposed at one surface of said holding member, and the other end of said each electroconductive member being exposed at the other surface of said each holding member, said process having the following steps, namely:
   the first step of irradiating on a matrix having on a first insulating layer which is said holding member a second insulating layer of a material different from said first insulating layer to form a plurality of holes perforated therethrough;
   the second step of connecting said matrix to a base member for supporting said matrix bonding;
   the third step of etching a part of the base member exposed by said plurality of holes formed through said matrix;
   the fourth step of filing an electroconductive material which becomes said electroconductive member into said holes and the etched concavities; and
   the fifth step of removing said base member and said second insulating layer.

71. A process according to claim 70, wherein etching is carried out for changing the shape of the holes of said second insulating layer before said second step.

72. A process according to claim 70, wherein etching is carried out for changing the shape of the holes of said second insulating layer after said second step.

73. A process according to claim 70, wherein etching is carried out for changing the shape of the holes of said second insulating layer simultaneously with said third step.

74. A process for preparing an electrical connecting member having a holding member comprising an electrically insulating material and plurality of electroconductive members equipped in said holding member under the state mutually insulted from each other, one end of said each electroconductive member being exposed at one surface of said holding member, and the other end of said each electroconductive member being exposed at the other surface of said each holding member, said process having the following steps, namely;
   the first step of irradiating a high energy beam on a matrix having on a first insulating layer which is said holding member a second insulating layer of a material different from said first insulating layer to form a plurality of holes extending therethrough;

the second step of forming concavities on the base member for supporting said matrix at the positions corresponding to the positions of the hole formed through said matrix;

the third step of performing registration between the holes formed on said matrix and the concavities formed on the base member, and connecting said holding member to said base member by bonding;

the fourth step of filing an electroconductive material which becomes said electroconductive member into the holes formed in said matrix and the concavities; and the fifth step of removing said base member and said second insulating layer.

75. A process according to claim 74, wherein etching is carried out for changing the shape of the holes of said second insulating layer before said third step.

76. A process according to claim 74, wherein etching is carried out for changing the shape of the holes of said second insulating layer after said third step.

77. A process according to claim 75 or 76, having the step of filling the concavities of said base member with a soluble material different from said first or second insulating layer before said third step and the step of removing said soluble material before said fourth step.

* * * * *

UNITED STATES PATENT AND TRADEMARK OFFICE
CERTIFICATE OF CORRECTION

PATENT NO. : 5,379,515

DATED : January 10, 1995

INVENTOR : HIROSHI KONDO, ET AL

Page 1 of 5

It is certified that errors appear in the above-identified patent and that said Letters Patent is hereby corrected as shown below:

On the title page:

[21] Appln. No.

"20,141" should read --197,549--.

[56] References Cited

U.S. Patent Documents, "Amane et al." should read --Amano et. al.--; and

"Yoshigawa et al." should read --Yoshizawa et al.--.

Foreign Patent Documents, "63222437  9/1988 Japan"
"88224235  9/1988 Japan" should read --63-222437  9/1988 Japan;
88-224235  9/1988 Japan--; and "91-07073  5/1991 WIPO" should read --91/07073  5/1991 WIPO--.

COLUMN 3
line 22
"shrinked" should read --shrunk--; and
line 33
"imidated" should read --indicated--.

COLUMN 4

Line 38, "is" should read --is to--.

COLUMN 7

Line 50, "Thus" should read --the--.

UNITED STATES PATENT AND TRADEMARK OFFICE
CERTIFICATE OF CORRECTION

PATENT NO. : 5,379,515

DATED : January 10, 1995

INVENTOR : HIROSHI KONDO, ET AL

It is certified that errors appear in the above-identified patent and that said Letters Patent is hereby corrected as shown below:

COLUMN 8

Line 7, "Also" should read --¶ Also--.

COLUMN 10

Line 32, "end" should read --and--;

Line 33, "end" should read --and--;

Line 39, close up right margin; and

Line 40, close up left margin; and "Of" should read --of--.

COLUMN 12

Line 39, "thus" should read --this way--.

COLUMN 13

Line 66, "FIGS. 13A - 13I" should read --FIGS. 13A -13I are--.

COLUMN 14

Line 14, "end" should read --and--;

Line 23, "Similarly" should read --Similarly,--;

Line 43, Similarly" should read --Similarly,--.

UNITED STATES PATENT AND TRADEMARK OFFICE
CERTIFICATE OF CORRECTION

PATENT NO. : 5,379,515

DATED : January 10, 1995

INVENTOR : HIROSHI KONDO, ET AL

It is certified that errors appear in the above-identified patent and that said Letters Patent is hereby corrected as shown below:

COLUMN 15

Line 43, "Similarly" should read --Similarly,--; and

Line 63, "Similarly" should read --Similarly,--.

COLUMN 16

Line 4, "popes" should read --pores--;

Line 13, "show" should read --shown--;

Line 44, "Similarly" should read --Similarly,--;

Line 59, "alternatively" should read --alternatively,--; and

Line 65, "holes" should read --holes 7--.

COLUMN 17

Line 14, "14" should read --14,--;

Line 52, "Au," should read --Au, Ag,--; and

Line 53, "Ni." should read --Ni,--.

COLUMN 18

Line 24, "PbSn," should read --Pb-Sn,--.

UNITED STATES PATENT AND TRADEMARK OFFICE
CERTIFICATE OF CORRECTION

PATENT NO. : 5,379,515

DATED : January 10, 1995

INVENTOR : HIROSHI KONDO, ET AL          Page 4 of 5

It is certified that errors appear in the above-identified patent and that said Letters Patent is hereby corrected as shown below:

COLUMN 19

Line 22, "the size of at least a part of the" should be deleted; and

Line 23, "concavities should be" should be deleted.

COLUMN 20

Line 23, "Also" should read --Also,--.

Line 42, "prising;" should read --prising:--.

COLUMN 22

Line 28, "filing" should read --filling--.

UNITED STATES PATENT AND TRADEMARK OFFICE
CERTIFICATE OF CORRECTION

PATENT NO. : 5,379,515

DATED : January 10, 1995

INVENTOR : HIROSHI KONDO, ET AL

It is certified that errors appear in the above-identified patent and that said Letters Patent is hereby corrected as shown below:

<u>COLUMN 23</u>

Line 7, "hight" should read --high--; and

Line 18, "wherein said" should be deleted.

Signed and Sealed this

Twelfth Day of December, 1995

Attest:

BRUCE LEHMAN

*Attesting Officer*     *Commissioner of Patents and Trademarks*